United States Patent [19]
Hirose et al.

[11] Patent Number: 6,122,170
[45] Date of Patent: Sep. 19, 2000

[54] POWER MODULE BOARD AND POWER MODULE USING THE BOARD

[75] Inventors: Yoshiyuki Hirose; Kazutaka Sasaki; Mitsuru Shimazu; Hirohiko Nakata, all of Itami, Japan

[73] Assignee: Sumitomo Electric Industries, Ltd., Osaka, Japan

[21] Appl. No.: 09/343,167

[22] Filed: Jun. 29, 1999

[30] Foreign Application Priority Data

Jun. 30, 1998 [JP] Japan ................................. 10-184217
Jan. 29, 1999 [JP] Japan ................................. 11-021480

[51] Int. Cl.[7] ........................................... H05K 7/20
[52] U.S. Cl. ...................... 361/704; 361/700; 361/702; 361/719; 361/746; 361/807; 361/820; 257/707; 257/711; 257/712; 174/16.3
[58] Field of Search ...................... 361/704–710, 361/717–719, 721–723, 801, 807, 728, 820, 746, 809, 812, 700–702, 720; 257/678, 687, 690, 696, 706–726, 700, 701–703, 691–693, 762–764, 770; 174/52.1, 16.3, 52.4; 228/123, 121, 124, 180.2, 124.1, 196, 262.6, 262.2

[56] References Cited

U.S. PATENT DOCUMENTS

| | | | |
|---|---|---|---|
| 4,611,745 | 9/1986 | Nakahashi et al. ................ | 228/123 |
| 5,258,887 | 11/1993 | Fortune ................................. | 361/720 |
| 5,291,065 | 3/1994 | Arai et al. ............................. | 257/723 |
| 5,394,011 | 2/1995 | Yamamoto et al. .................. | 257/693 |
| 5,490,627 | 2/1996 | Krum et al. ........................ | 228/124.1 |
| 5,539,254 | 7/1996 | Eytcheson et al. ................... | 257/691 |
| 5,561,321 | 10/1996 | Hirano et al. ......................... | 257/700 |
| 5,654,586 | 8/1997 | Schwarzbauer ...................... | 257/701 |
| 5,850,104 | 12/1998 | Avis ...................................... | 257/726 |
| 5,949,649 | 9/1999 | Bartlow ................................ | 361/704 |
| 5,956,231 | 9/1999 | Yamada et al. ...................... | 361/728 |

FOREIGN PATENT DOCUMENTS 9-275166  10/1997  Japan .

*Primary Examiner*—Leo P. Picard
*Assistant Examiner*—Michael Datskovsky
*Attorney, Agent, or Firm*—W. F. Fasse; W. G. Fasse

[57] ABSTRACT

A ceramic base plate of aluminum nitride ceramics, for example, as a power module board has a metal layer on a surface of the ceramic base plate at a fixing portion at which the ceramic base plate is fixed onto a heat radiating plate. Further, a metal film is provided entirely on the rear surface of the ceramic base plate. An IGBT chip or the like is fixed onto the ceramic base plate with a conductive layer interposed therebetween, to form a power module board. Therefore, it is possible to avoid the generation of cracks when the ceramic base plate is mechanically fixed onto the heat radiating plate without using solder, and heat radiation from the ceramic base plate to the heat radiating plate can be improved.

12 Claims, 21 Drawing Sheets

| MATERIAL | THERMAL CONDUCTIVITY (W/m·k) | COEFFICIENT OF THERMAL EXPANSION ($\times 10^{-6}/°C$) |
|---|---|---|
| ALUMINUM NITRIDE (AlN) CERAMICS | 100~200 | 4.0~4.5 |
| SILICON NITRIDE (Si3N4) CERAMICS | 50~150 | 3.0~3.2 |
| COPPER (Cu) | 380~400 | 15~17 |
| ALUMINUM (Al) | 200~230 | 23~25 |
| TUNGSTEN (W) | 200~210 | 4.0~4.3 |
| NICKEL (Ni) | 90~95 | 13~15 |
| SEMICONDUCTOR DEVICE Si | / | 3.9~4.1 |
| Al50 WT%−SiC (USED FOR THE BASE) | 160~200 | 10~12 |
| Cu10 WT%−W (USED FOR THE BASE) | 200~230 | 5.0~5.5 |

ENTIRELY ON OPPOSING ENDS

PORTIONS I ON OPPOSING ENDS

PORTIONS II ON OPPOSING ENDS

PERIPHERY I OF FIXING PORTION

ENTIRE PERIPHERY

PERIPHERY II OF FIXING PORTION

POWER MODULE BOARD AND POWER MODULE USING THE BOARD

BACKGROUND OF THE INVENTION

1. Field of the Invention

The present invention relates to a power module board and a power module using the board. More specifically, the present invention relates to a power module board and a power module using the board, which board is used as a radiator board for a power module (power conversion device) such as a machine tool with an electronic control device controlling a motor, an electric car, an electric train or other device in which a large power flow is controlled by a semiconductor device.

2. Description of the Background Art

In order to drive a motor of a machine tool, an electric car, an electric train or the like, a power module performing DC-AC conversion and DC-DC conversion has been employed. The power module includes an IGBT (Insulated Gate Bipolar Transistor) unit for performing DC-AC conversion, a counter flow preventing capacitor, a control circuit unit and so on.

A large current is taken out from a front surface and a rear surface of the IGBT chip (here it is assumed that the chip includes a semiconductor device). Therefore, high electric insulation is required of a board on which the IGBT chip is fixed. Further, as an electrode for taking out current from the rear surface is formed on an electrically insulating board, a conductor layer must be formed on the electrically insulating board.

Generally, a thin film mainly consisting of copper (for example, a layer formed of copper foil) is used as the conductor layer, which thin layer is provided between IGBT chip and ceramic base plate, with an intervening layer therebetween.

Further, chip temperature of the IGBT chip increases because of heat for bonding generated at the time of mounting, and because of heat generated by the semiconductor device in operation, as a large current is controlled. Therefore, the board on which the IGBT chip is fixed and the entire board including peripheral members must have high radiation characteristic. If radiation from the board is insufficient, the temperature of the semiconductor device becomes too high to enable current control, and in the worst case, the semiconductor device may be broken.

FIG. 22 is a cross section of a conventional power module. In the conventional power module, IGBT chip 6 is fixed by solder on a copper layer 8 on a ceramic base plate 1 as an insulating base plate, and the ceramic base plate 1 is fixed by solder on a metal base 12. In FIG. 22, control circuits are not shown.

Referring to the figure, on a heat radiating plate 5 formed of a metal having high thermal conductivity such as copper or aluminum, base 12 is placed. Base 12 is fixed on heat radiating plate 5 by means of a bolt 4. Though not shown, at an interface between heat radiating plate 5 and base 12, a thin layer of silicon oil compound or the like is formed to reduce thermal resistance at the interface.

On base 12, a resin case 10 encapsulating the current control unit is fixed by means of an adhesive, for example. On base 12 in case 10, ceramic base plate 1 on which a control circuit part is mounted is fixed by solder. More specifically, a control circuit having the intervening layer and conductive layer 8 mainly consisting of copper stacked with each other is formed, on ceramic base plate 1 with one end connected to an external circuit through an electrode 9.

Circuit components such as semiconductor device 6 and diode 7 are soldered on conductive layer 8. The space of the encapsulating case 10 is filled with silicon gel, for example. Here, wire bonding between the semiconductor device, diode and the like are not shown.

Base 12 is formed of a metal such as copper or aluminum, or a composite material containing a higher proportional amount of metal such as copper-tungsten or aluminum-silicon carbide. Aluminum nitride ceramics is used for ceramic base plate 1, as it requires electrical insulation and high thermal conductivity.

For a power module having the IGBT chip of large capacity and hence large amount of heat build up, a structural member improving radiation such as a water cooling radiator or an air cooling fan is arranged inside or below heat radiating plate 5.

With respect to the structure of conductive layer 8, as disclosed in Japanese Patent Laying-Open No. 9-275166, various structures of the intervening layer have been proposed to relax thermal stress between the copper conductive layer and the ceramic base plate formed of aluminum nitride ceramics, for example, which have very different coefficients of thermal expansion.

Not only one unit of the combination of ceramic base plate-intervening layer-conductive layer but two or more units of this combination in this order may be stacked to form a module.

For example, at the portion of conductive layer 8 shown in FIG. 22, for example on the ceramic base plate, two or more units may be stacked, such as intervening layer-conductive layer-intervening layer-ceramic layer-intervening layer-conductive layer-intervening layer- . . . .

As described above, in the conventional power module, IGBT chip 6 as a semiconductor device is fixed on base 12 with a ceramic base plate 1 interposed. In order to simplify this structure to reduce cost, it may be possible to directly fix the electrically insulating ceramic base plate having high thermal conductivity such as aluminum nitride ceramic on the box body, for example, without using base 12.

In this case, two different configurations are possible. Namely, the configuration of FIG. 23A in which ceramic base plate 1 is used as an integral body on which a plurality of IGBT chips 6 are fixed, and a configuration of FIG. 23B in which ceramic base plate 1 is divided (in this example, divided into two).

In either of the configurations of FIGS. 23A and 23B, when ceramic base plate 1 is directly fixed by a bolt 4 or the like or by interposing a washer 16 as shown in FIGS. 23A and 23B, cracks generate at portions where stress concentrates, at the fixing portion, as ceramic base plate 1 has lower mechanical strength, as compared with when base 12 (see FIG. 22) is used for fixing.

When IGBT chip 6 as the semiconductor device operates and temperature increases, greater stress generates at the fixing portion, resulting in cracks, because of the difference in the coefficients of thermal expansion between conductive layer 8 and ceramic base plate 1 and between heat radiating plate 5 and ceramic base plate 1.

Further, as fixing on radiating plate 5 is done without using solder, radiation must be performed with high efficiency. In order to improve thermal conductivity of base 12 and heat radiating plate 5, it is possible to reduce thermal resistance at the interface between heat radiating plate 5 and ceramic base plate 1 by applying silicon oil compound. Aluminum nitride ceramics or silicon nitride ceramics used as the material of ceramic base plate 1, however, has poor wetting property with silicon oil compound.

Further, at the fixing portion where ceramic base plate 1 is fixed on heat radiating plate 5, heat resistance must be decreased. When a washer is used as is conventionally common, the problem of higher heat resistance at the fixing portion results. When the conventional base containing metal is used, increase in heat resistance can be suppressed even when there are small recesses or protrusions on the surface of heat radiating plate 5, as base 12 deforms to reduce air layer at the interface therebetween. When the ceramic base plate is used as the base, there arises a problem that cracks generate from the small recesses or protrusions.

When the configurations of FIG. 23A and 23B are compared, the area of the expensive ceramic base plate 1 is relatively small in FIG. 23B as compared with FIG. 23A, and therefore the cost for the raw material can be reduced. At the time of mounting, thermal stress can be dispersed and relaxed. This effect is promoted when ceramic base plate 1 is divided into larger number. Further, it is expected in the future that the ceramic base plate 1 comes to be thinner, and that the degree of integration of IGBT chip 6 is increased, resulting in larger amount of heat. The configuration of FIG. 23B is considered to be more advantageous for apparatuses of larger size. The configuration of FIG. 23B, however, requires higher cost for fixing, as the number of units to be mounted and fixed increases, as compared with the configuration of FIG. 23A.

Further, in order to reduce the area of ceramic base plate 1, use of a fixing jig 3 such as shown in FIG. 24 is more advantageous than direct fixing by means of bolt 4, as the portion of the base plate in which the bolt hole is formed can be saved. When only a pair of sides of ceramic base plate 1 are fixed as shown in FIG. 24, ceramic base plate 1 may highly possibly be displaced when a force parallel to the sides is applied. In view of safety against impact, this is a significant problem especially in a car or other vehicle.

SUMMARY OF THE INVENTION

An object of the present invention is to eliminate cracks generated when an aluminum nitride ceramic board (on which an IGBT chip is fixed) is mechanically fixed without using solder, and to improve heat radiation characteristic from the aluminum nitride ceramic board to a heat radiating plate or the like.

Another object of the present invention is to provide an inexpensive means for fixing the ceramic base plate.

A still further object of the present invention is to provide safe means for fixing the ceramic base plate.

The above described objects can be attained by the present invention in which, in order to prevent the fixing jig and the ceramic base plate from being brought into direct contact by mechanical or thermal deformation at the time of mounting or at the time of actual operation of the module, which contact undesirably causes stress concentration, and to improve heat radiation from the fixing jig, a metal layer having low Young's modulus and high thermal conductivity is inserted at a contact portion between ceramic base plate and the fixing jig, or a metal having low Young's modulus and high thermal conductivity is used as a core material of the fixing jig.

Further, in order to prevent generation of cracks in the ceramic base plate caused by small projections on the heat radiating plate, to improve wetting property of the silicon oil compound applied to the ceramic base plate and to improve heat radiation from the board, a metal layer is provided on the rear surface of the ceramic base plate.

More specifically, the present invention provides a power module board employing a ceramic base plate, including a current control unit mounting a semiconductor device and sealed, and a fixing portion for fixing the ceramic base plate on a heat radiating plate, the current control unit including at least one stacked structural unit with a conductive layer provided on the ceramic base plate with an intervening layer therebetween, the semiconductor device being mounted on an uppermost layer of the stacked structure, and the fixing portion having a fixing seat area including a metal layer provided on the ceramic base plate with an intervening layer therebetween.

Preferably, the material of the ceramic base plate is aluminum nitride ceramics.

Alternatively, preferably, the material of the ceramic base plate is silicon nitride ceramics.

Preferably, the conductive layer of the current control unit is a metal material containing, as a main component, any of copper, aluminum and nickel.

Preferably, the metal layer on the fixing portion is a metal material containing, as a main component, any of copper, aluminum and nickel.

Preferably, a metal film is provided on the rear surface of the ceramic base plate. More preferably, the metal film on the rear surface of the ceramic base plate is a metal material containing, as a main component, any of copper, aluminum and nickel.

The present invention also encompasses a power module including the above described power module board.

Use of silicon nitride ceramics as a material of the ceramic base plate in the present invention is advantageous in that as compared with aluminum nitride ceramics, silicon nitride ceramics provides three times or four times higher bending strength, so that when the device is mounted on the heat radiating plate, it is possible to reduce the thickness of the base plate, to withstand concentrated load derived from mechanical stress or thermal stress in actual operation. Though silicon nitride ceramics has poorer thermal conductivity than aluminum nitride ceramics, heat resistance can be made smaller if the thickness is reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 11A to 11C are illustrations of a detailed structure when the ceramic base plate is fixed by the fixing jigs in accordance with an embodiment of the present invention, in which FIG. 11A is a plan view, FIG. 11B is a cross section taken along the line A–A' of FIG. 11A, and FIG. 11C is a cross section taken along the line B–B' of FIG. 11A.

FIGS. 13A to 13C are illustrations representing a detailed structure when the ceramic base plate is fixed by the fixing jigs in accordance with an embodiment of the present invention in which FIG. 13A is a plan view, FIG. 13B is a cross section taken along the line A–A' of FIG. 13A and FIG. 13C is a cross section taken along the line B–B' of FIG. 13A.

FIGS. 15A to 15C are illustrations representing a detailed structure when the ceramic base plate divided into three is fixed by a fixing jig in accordance with an embodiment of the present invention, in which FIG. 15A is a plan view, FIG. 5B is a cross section taken along the line A–A' of FIG. 15A, and FIG. 15 is a cross section taken along the line B–B' of FIG. 15A.

FIGS. 16A to 16C are illustrations representing a detailed structure when divided ceramic base plates are fixed by a fixing jig in accordance with an embodiment of the present invention, in which FIG. 16A is a plan view, FIG. 16B is a cross section taken along the line A–A' of FIG. 16A, and FIG. 16C is a cross section taken along the line B–B' of FIG. 16A.

FIGS. 17A to 17C are illustrations representing a detailed structure when the ceramic base plate divided into six is fixed by a fixing jig in accordance with an embodiment of the present invention, in which FIG. 17A is a plan view, FIG. 17B is a cross section taken along the line A–A' of FIG. 17A, and FIG. 17C is a cross section taken along the line B–B' of FIG. 17A.

FIGS. 18A to 18C are illustrations representing a detailed structure when a ceramic base plate divided into six is fixed by a fixing jig with a copper plate, in accordance with an embodiment of the present invention, in which FIG. 18A is a plan view, FIG. 18B is a cross section taken along the line A–A' of FIG. 18A, and FIG. 18C is a cross section taken along the line B–B' of FIG. 18A.

DESCRIPTION OF THE PREFERRED EMBODIMENTS

Figure 1:
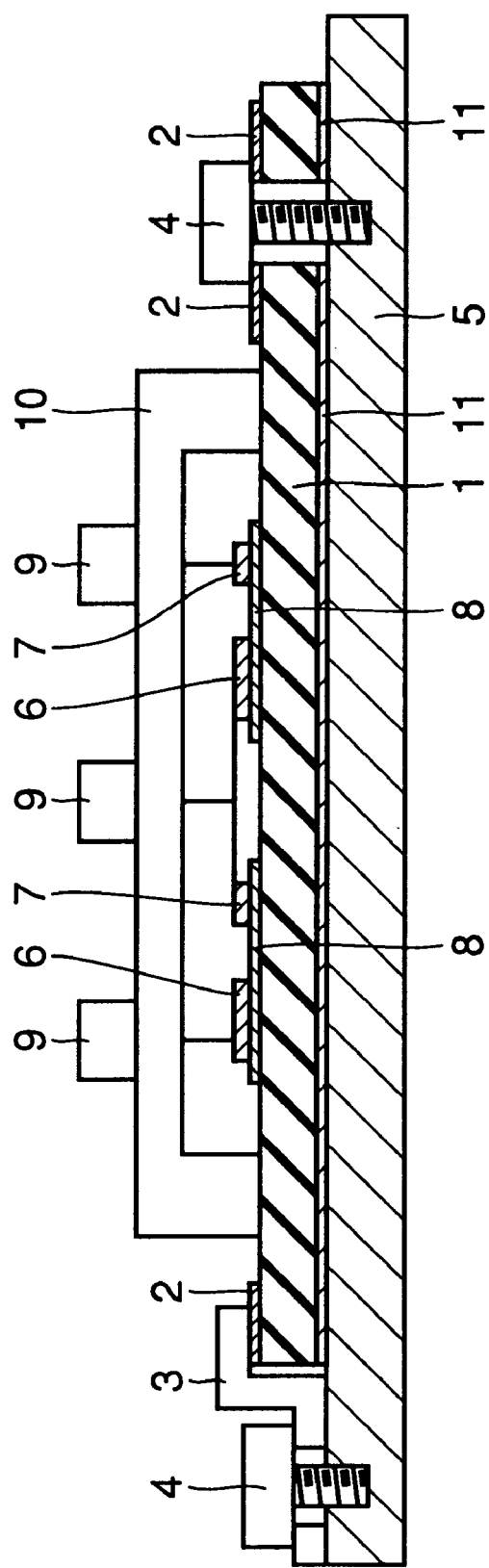
FIG. 1 is a cross section schematically showing a power module in accordance with an embodiment of the present invention.
Figure 22:
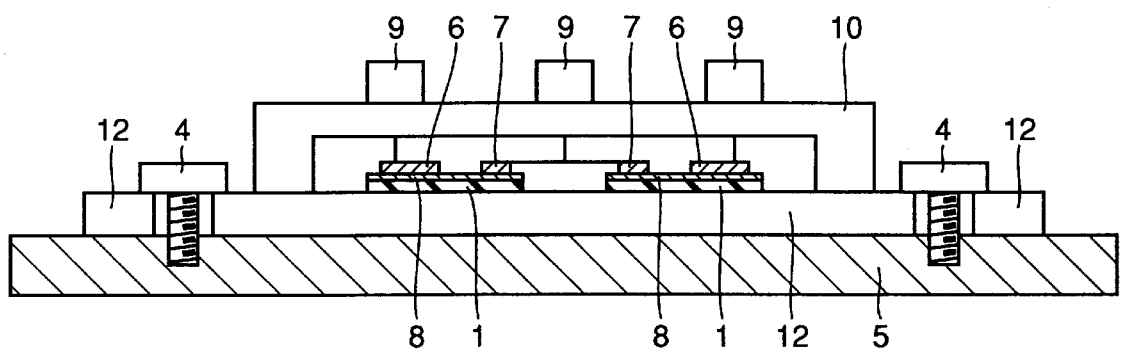
FIG. 22 is a cross section schematically representing a conventional power module.

FIG. 1 schematically shows a cross sectional structure of the power module in accordance with an embodiment of the present invention. Different from the structure of the conventional power module described with the reference to FIG. 22, base 12 formed of metal or a composite material containing much metal is not used. The power module is provided by integrating electrically insulating ceramic base plate having high thermal conductivity enlarged in size, with a conductive layer 8 formed on an upper surface, with a conventionally used resin case 10.

Here, the board itself formed of ceramic material will be referred to as ceramic base plate 1, and the ceramic base plate 1 having a prescribed metal layer 2 and a conductive layer 8 formed on a surface and a prescribed metal film 11 formed on a rear surface will be referred to as a power module board. The power module board coupled with a prescribed electrode 9 and a case 10 will be referred to as a power module. In the following, the same or corresponding portions will be denoted by the same reference characters.

Fixing of the power module on a heat radiating plate 5 is attained by fixing the module by a bolt 4 with a metal layer 2 interposed as shown on the right side of FIG. 1, by fixing the module by a fixing jig 3 with metal layer 2 interposed as shown on the left side of the figure, or by any other known method of fixing additionally using the metal layer 2 interposed.

According to the structure of the present embodiment, it is possible to form the conductive layer 8 for the current control circuit in case 10 simultaneously with metal layer 2 which is a buffer layer for the clamping stress at the fixing portion.

As described above, conductive layer 8 in case 10 should be bonded on ceramic base plate 1 with thermally and mechanically sufficient state of bonding with ceramic base plate 1, so that the conductive layer is formed by first forming a layer containing metal having high melting point or an active metal on the side of ceramic base plate 1, and a thin second layer such as a plating layer, mainly containing metal such as Cu, Ni or Ag is formed thereon. These layers serve as an intervening layer for providing conductive layer 8.

As to the basic pattern shapes and arrangement of metal layer 2 at the fixing portion in accordance with the present embodiment, various designs such as shown in FIGS. 2A to 2F are possible, for one integral ceramic base plate 1, for example. These metal layers 2 are formed in the similar manner. Namely, first, an intervening layer is formed to cover the fixing portion partially or entirely. Though an intervening layer on the side of ceramic base plate 1, that is, facing ceramic base plate 1 is not explicitly shown for metal layer 2, metal layer 2 is generally represented as including the intervening layer. Description of the patterns of metal layer 2 will be given later.

When there are a plurality of IGBT chips 6, for example, when there are six or more IGBT chips, arranged on one power module, it is possible to arrange all the chips on one integral ceramic base plate 1. In order to attain higher durability against thermal and mechanical stress and to reduce the cost of the material of ceramic base plate 1 as described above, it is advantageous to reduce the overall volume of the ceramic base plate 1 and arrange the divided plates.

Further, when divided, ceramic base plate 1 warps less when subjected to heat generated by the conduction of IGBT chip 6. Therefore, even when ceramic base plate 1 is made thin, increase in temperature of IGBT chip 6 derived from increased thermal resistance caused by warp can be suppressed.

When the base plate is divided into two and the ceramic base plate 1 is reduced in thickness from 2 mm to 1 mm, the volume of aluminum nitride ceramic base plate can be reduced by about 36% in comparison to a ceramic base plate when not divided, and therefore material cost by that amount can be reduced. Further, it is technically difficult to manufacture a large ceramic base plate 1, and therefore, production yield can be improved if the base plate is divided and reduced in size. As a result, cost of the final product can be reduced.

Figure 23:
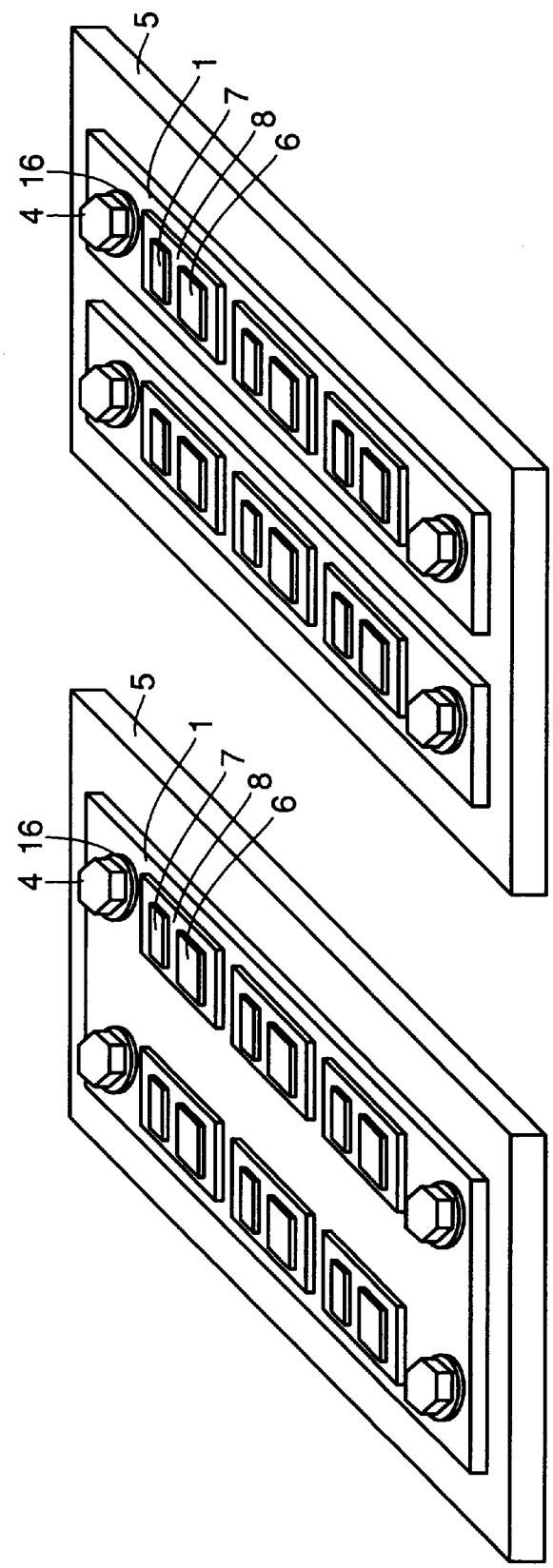
FIG. 23A is a perspective view representing a conventional method of fixing when the ceramic base plate is fixed by bolts.
FIG. 23B is a perspective view representing a conventional method of fixing when divided ceramic base plates are fixed by bolts.

In this divided arrangement, however, fixing of individual ceramic base plate 1 takes time and labor. Therefore, when there are six IGBT chips, for example, ceramic base plate 1 may be divided into two and fixed at four portions by bolts, as shown in FIG. 23B.

Alternatively, the methods of fixing ceramic base plate 1 shown in FIGS. 12 to 15 may be used.

In any of the fixing methods shown in FIGS. 12 to 15, fixing jigs 3 are used to fix opposing ends of each ceramic base plate 1.

Figure 16A:
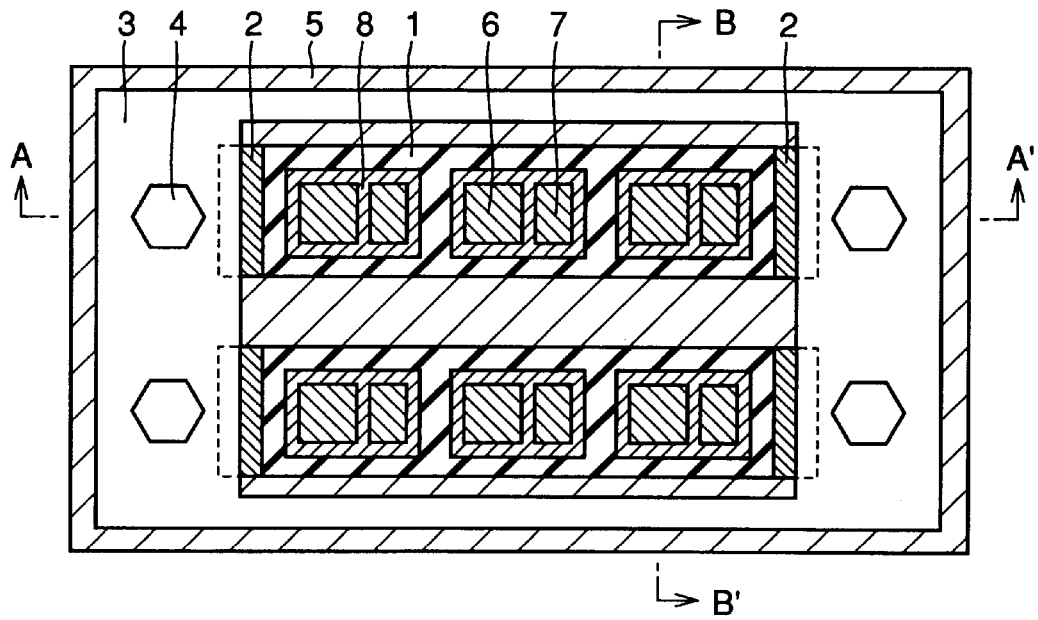
Figure 16B:
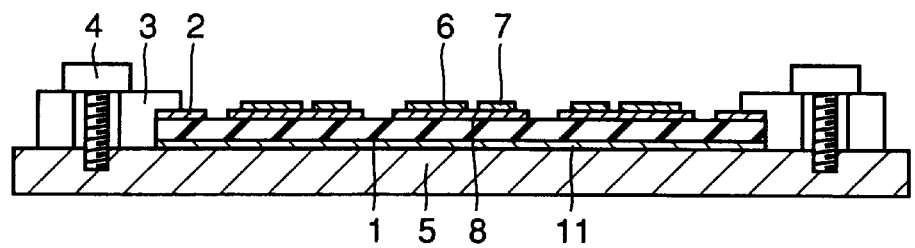
Figure 16C:
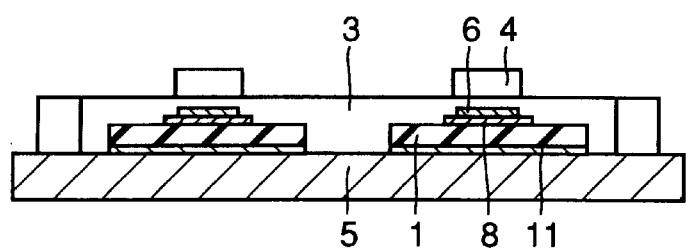

FIG. 16 shows another method of fixing in which fixing jig 3 is integrated.

In the structure shown in FIG. 16, ceramic base plate 1 is divided into two, with each divided piece having three IGBT chips 6, while fixing jig 3 has openings exposing six IGBT chips 6.

Figure 17A:
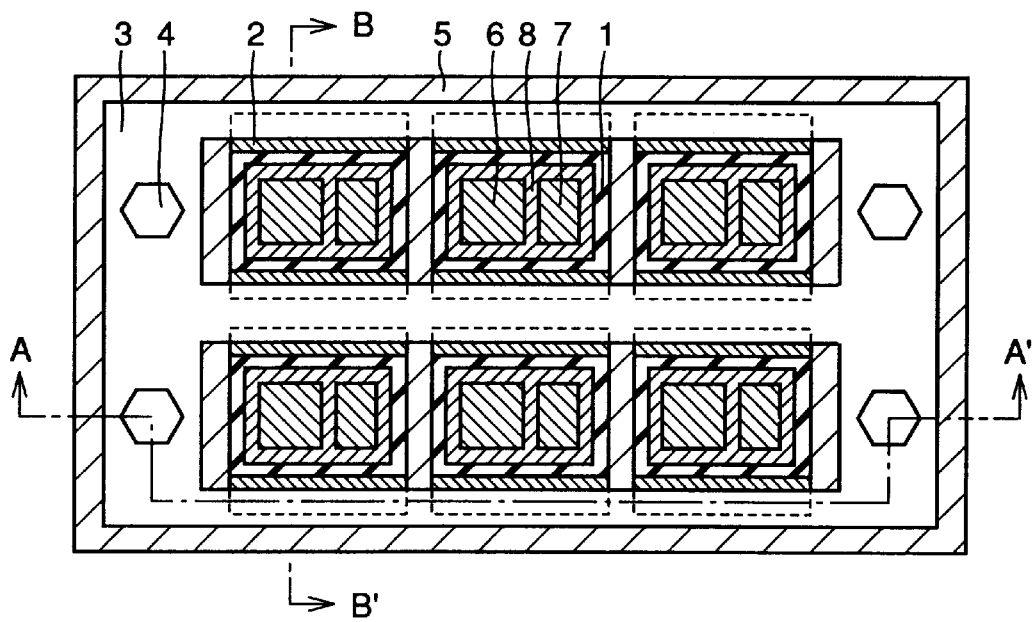
Figure 17B:
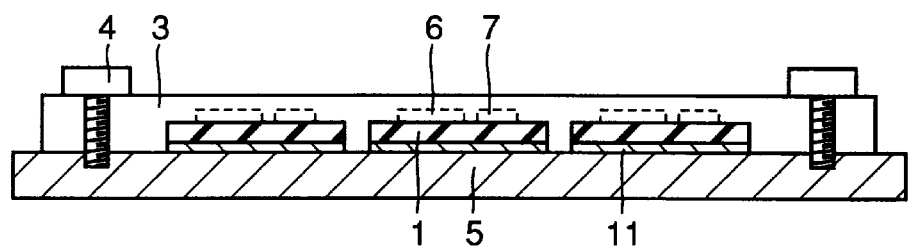
Figure 17C:
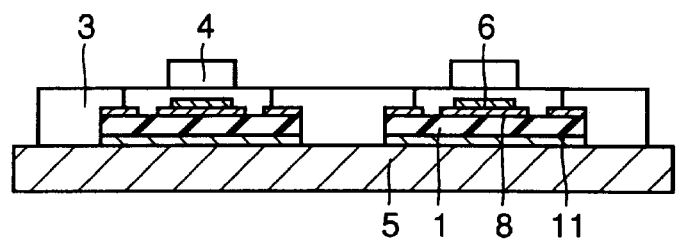

The structure of fixing jig 3 shown in FIG. 16 is also advantageous when six pieces of ceramic base plate 1 each having one IGBT chip 6 are to be fixed, as shown in FIG. 17.

Figure 19:
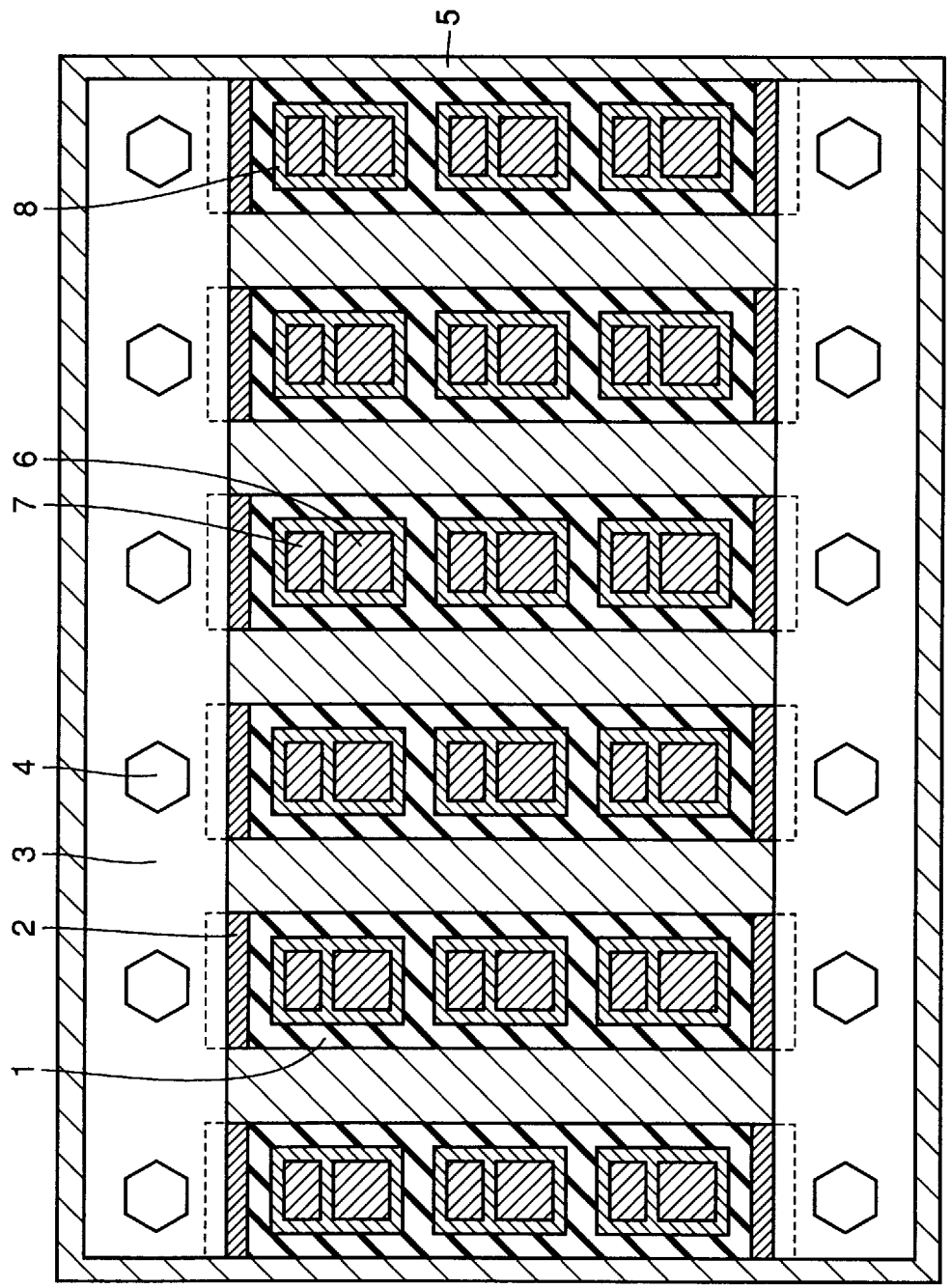
FIG. 19 is a plan view representing a detailed structure when six divided ceramic base plates are simultaneously fixed by fixing jigs in accordance with an embodiment of the present invention.

As another method of fixing, FIG. 19 shows a method in which three IGBT chips 6 are arranged on each of six ceramic base plates 1, and therefore there are eighteen IGBT chips 6.

Opposing ends of these divided and arranged six ceramic base plates 1 are fixed by two fixing jigs 3. For the ceramic base plate 1 arranged in this manner, the integrated fixing jig 3 having such openings as shown in FIG. 16 may be used.

In the structure in which ceramic base plate 1 is divided and arranged as described above, the pattern shape and arrangement of metal layer 2 basically provide contact portions between ceramic base plate 1 and fixing jig 3. The patterns may cover the contact portions partially or entirely. Examples of patterns of metal layer 2 including these structures are shown in FIGS. 20A to 20F.

Figure 20A:
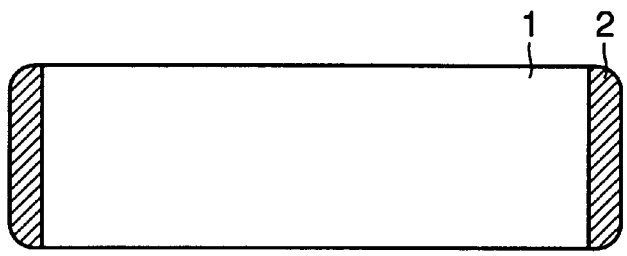
FIGS. 20A to 20F are plan views representing patterns of metal layer 2 formed on ceramic base plate in accordance with an embodiment of the present invention.
Figure 20B:
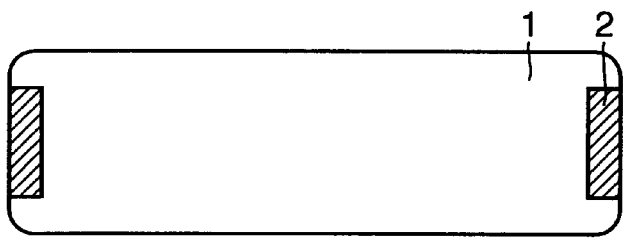
Figure 20C:
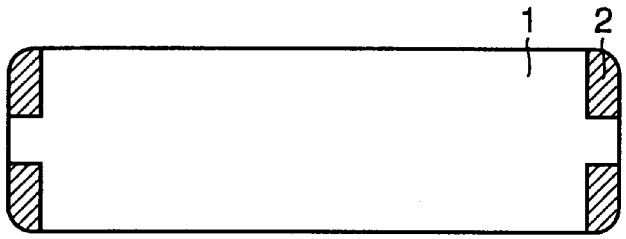

FIGS. 20B and 20C show metal layers 2 partially provided at opposing ends of ceramic base plate 1, though in different pattern shapes. These patterns may be applied to the arrangement of ceramic base plates 1 shown in FIGS. 1, 13 to 15 and 24.

Figure 20D:
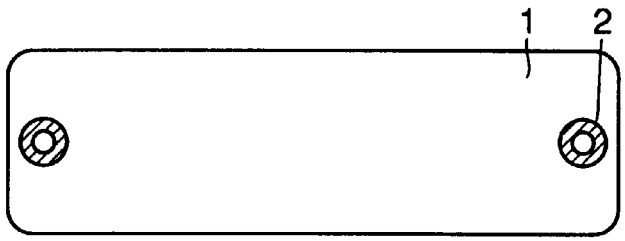
Figure 20E:
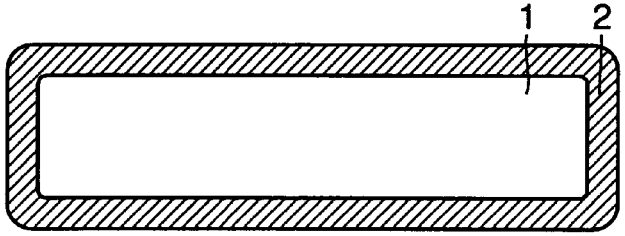
Figure 20F:
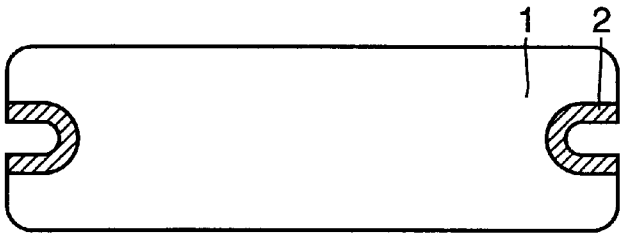

FIGS. 20D and 20F show metal layers provided around fixing portions on opposing ends of ceramic base plate 1, though in different pattern shapes. These patterns may be applied to the arrangement of ceramic base plate 1 shown in FIG. 23B described with reference to the prior art.

FIG. 20E shows a pattern in which metal layer 2 is provided on the entire periphery of ceramic base plate 1, which can be used when the entire periphery of the frame portion of ceramic base plate 1 is to be pressed by a clamp type jig or fixing jig 3 of FIGS. 1, 13 to 15 and 24.

Figure 10:
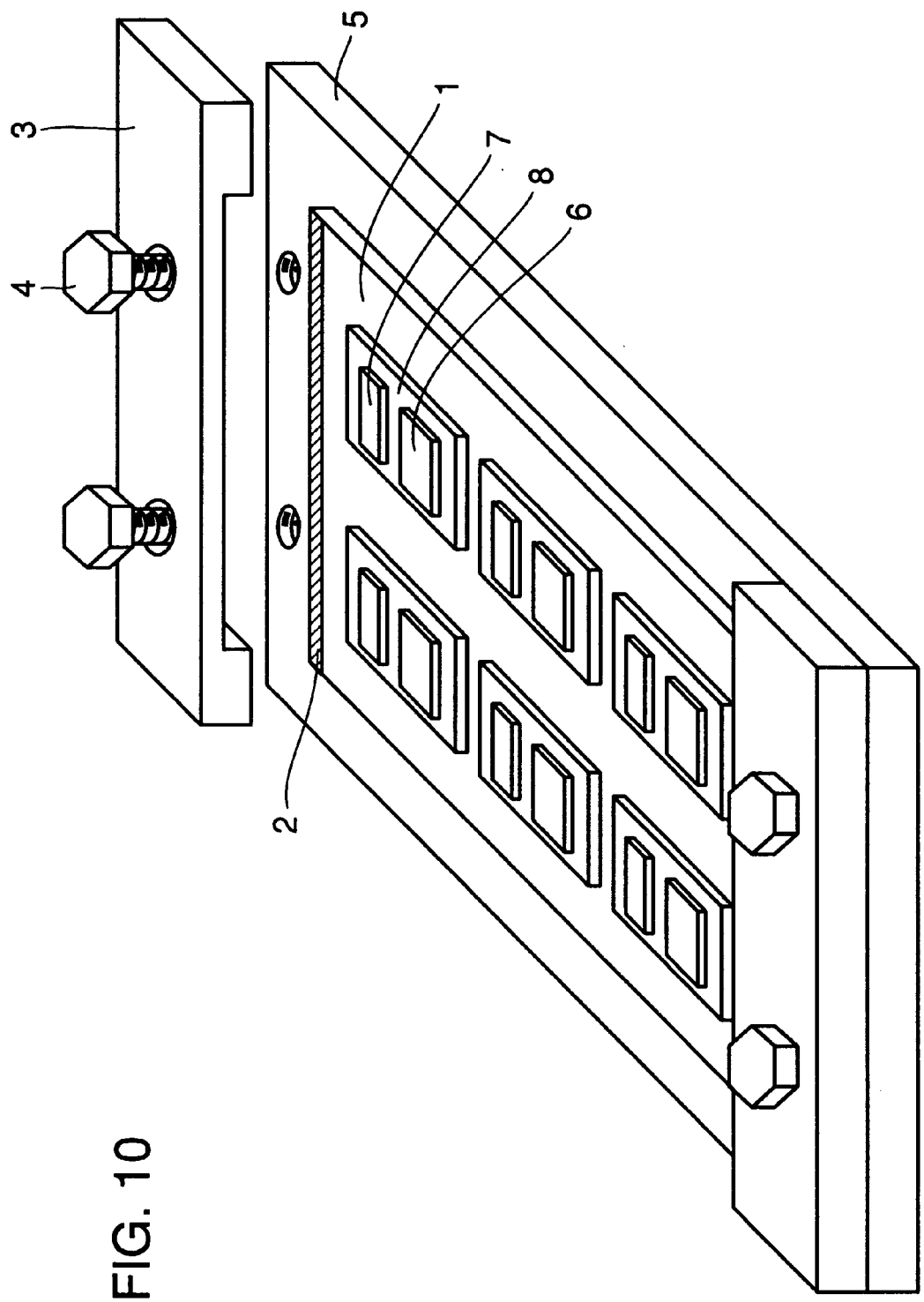
FIG. 10 is a perspective view related to a method of fixing when the ceramic base plate is fixed by the fixing jigs in accordance with an embodiment of the present invention.
Figure 11A:
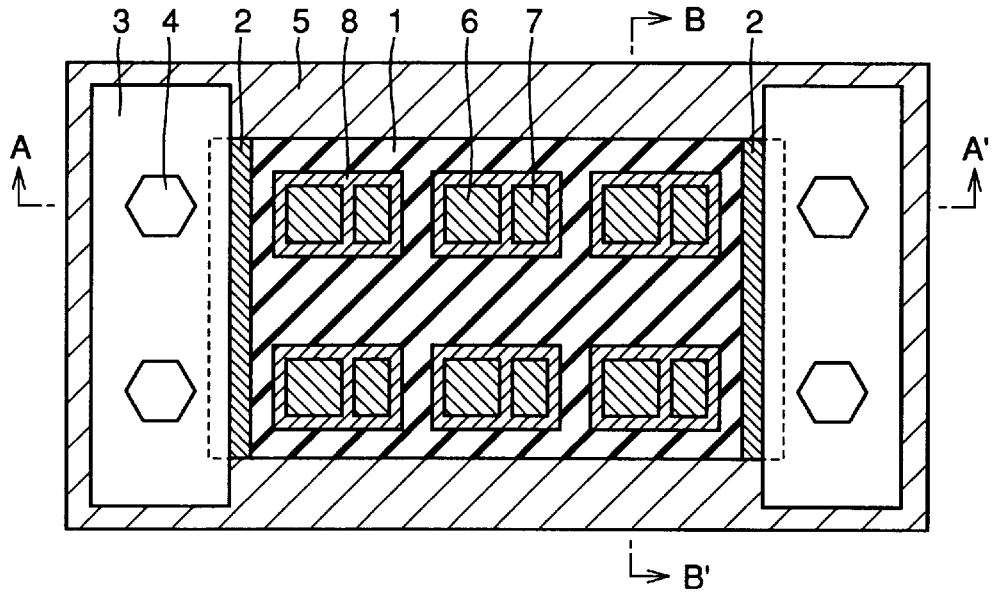
Figure 11B:
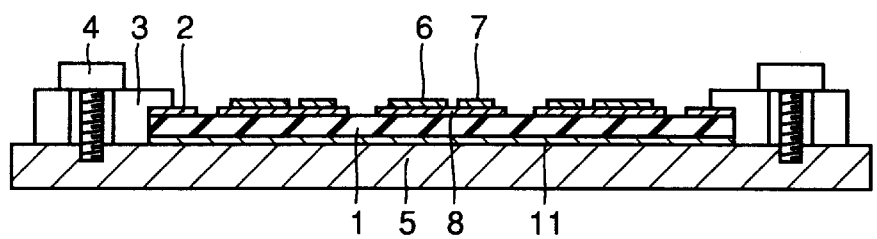
Figure 11C:
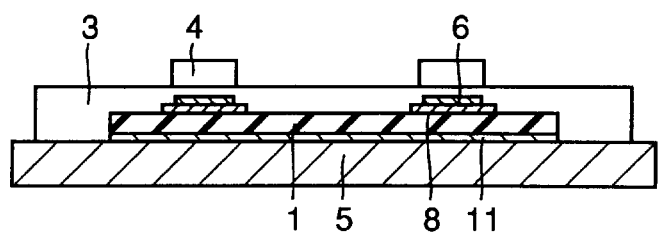
Figure 12:
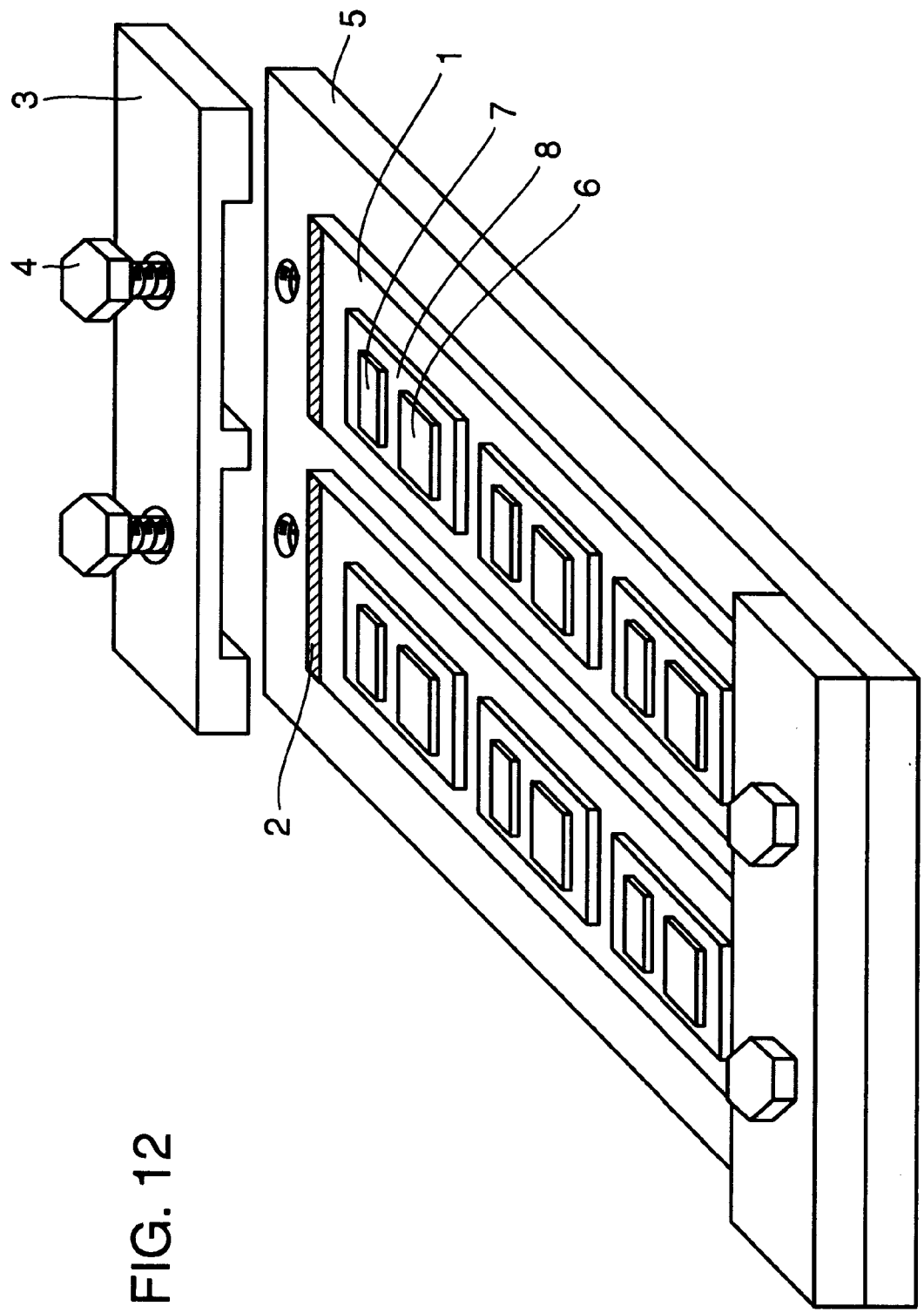
FIG. 12 is a perspective view related to a method of fixing when the ceramic base plate is fixed by fixing jigs in accordance with an embodiment of the present invention.
Figure 13A:
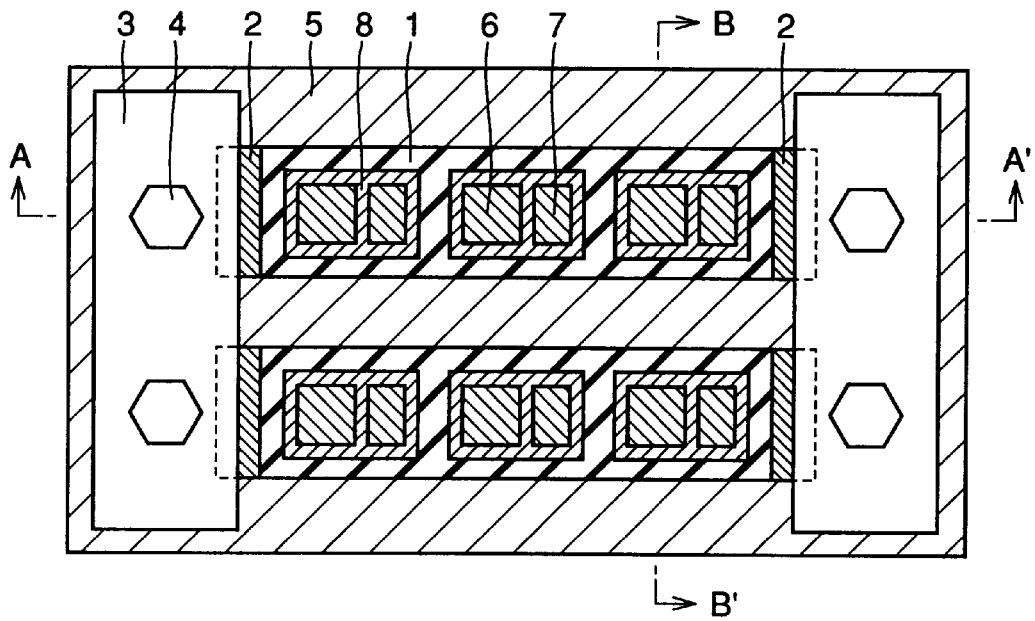
Figure 13B:
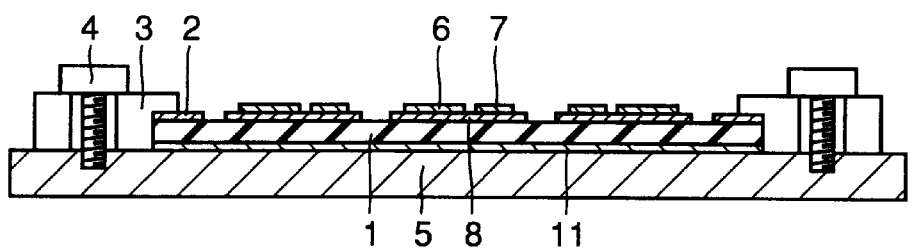
Figure 13C:
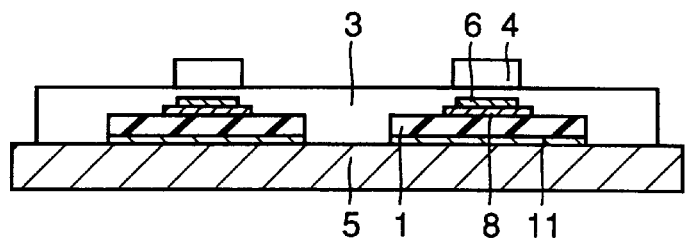
Figure 14:
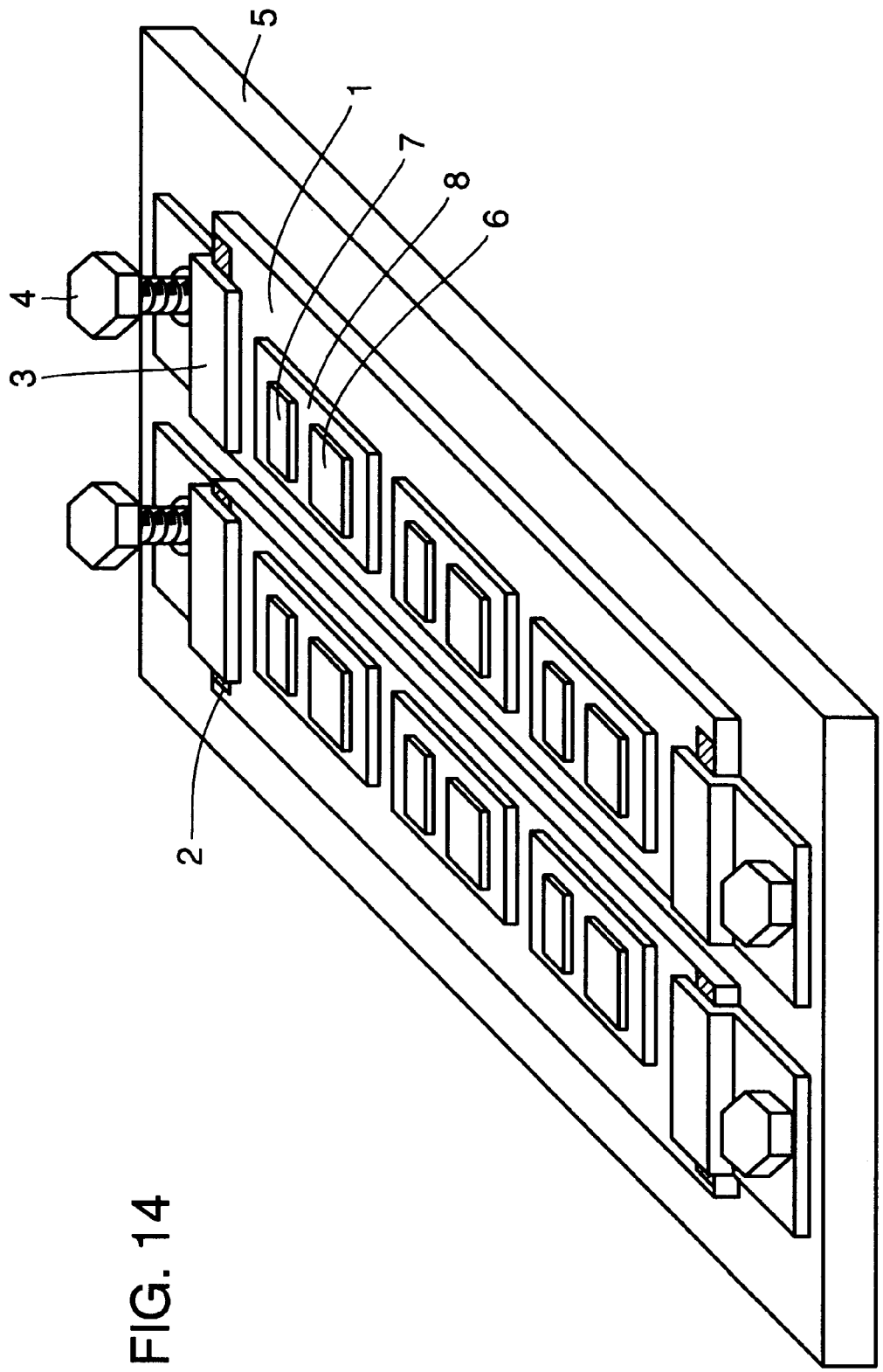
FIG. 14 is a perspective view related to a method of fixing divided ceramic base plates by fixing jigs, in accordance with an embodiment of the present invention.

The method of fixing by pressing opposing ends with fixing jig 3 shown in FIGS. 10, 12 and 14 is preferable in view of costs, as the necessary area of ceramic base plate 1 can be made smaller, as compared with the method of fixing directly by bolt 4 shown in FIGS. 23A and 23B.

Further, the method of FIGS. 10 and 12 in which ceramic base plate 1 is fixed at four corners is stronger against impact than when sides of ceramic base plate 1 are fixed as shown in FIG. 14. If the method of fixing shown in FIG. 14 is used, the ceramic base plate 1 can be supported by fixing jigs 3 against the force in a direction parallel to the longer side of ceramic base plate 1. However, fixing jig 3 is not effective against the force perpendicular to the longer side of ceramic base plate 1, so that the ceramic base plate 1 may possibly be displaced. This is a problem in view of safety a specially in a car or other vehicle. Therefore, the method of fixing shown in FIGS. 10 and 12 in which ceramic base plate 1 is fixed at four corners is advantageous in view of safety.

Figure 15A:
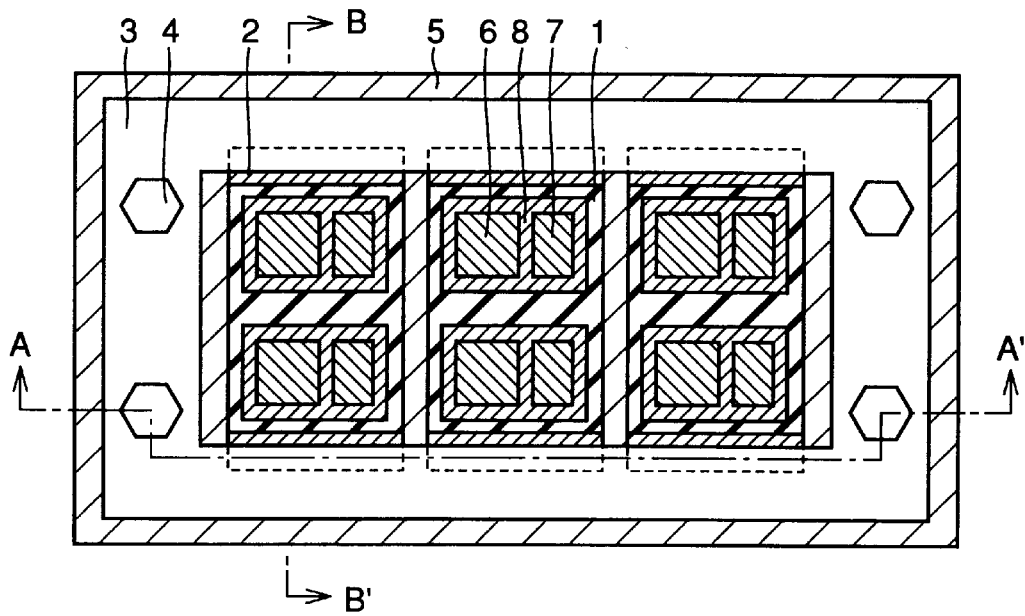
Figure 15B:
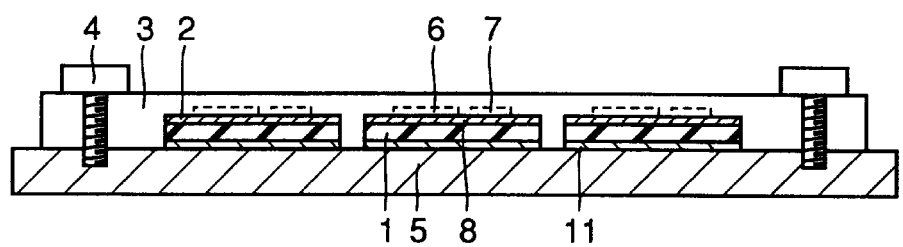
Figure 15C:
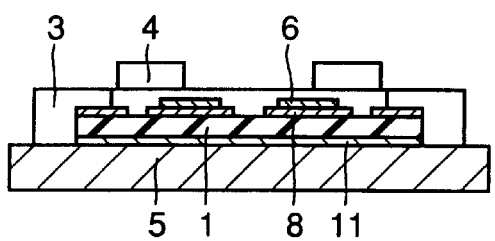

Further, the method of fixing in which the entire base plate is pressed uniformly by using the frame type fixing 13 shown in FIGS. 15 to 17 is preferred. More preferably, well balanced pressing using the net shape fixing jig 3 shown in FIG. 21 may be utilized, so that stress on ceramic base plate 1 can better be dispersed.

Therefore, according to the method of fixing ceramic base plate 1 in accordance with the embodiment of the present invention, when the intervening layer of the same structure is to be formed on ceramic base plate 1, the conductive layer 8 used for the current controlling unit in case 10 and metal layer 2 for the fixing portion can be formed simultaneously on ceramic base plate 1.

Further, when the first layer of the intervening layer is a metal layer having high melting point, it is possible at the time of forming ceramic base plate 1, to print both patterns simultaneously by a paste including metal having high melting point, and the patterns may be printed simultaneously with sintering of the ceramic base plate 1 (co-fire metalized method).

When a brazing layer including active metal is the first layer of the intervening layer, patterns may be simultaneously printed by a paste containing such metal on the sintered ceramic base plate 1. This method is applicable also when the first layer of the intervening layer contains a metal having high melting point (post fire metalized method).

Here, when the metal layer 2 on the surface of fixing portion and conductive layer 8 in case 10 are of the same material, for example, copper, the metal layer 2 at the fixing portion can be formed simultaneously with the conductive layer 8 of the current controlling unit.

When the conductive layer 8 at the current controlling unit is of copper and metal layer 2 at the fixing portion is of nickel, nickel plating may be provided for the second layer of intervening layers both for the conductive layer and the metal layer, and copper layer should be formed only at the conductive layer portion.

As to the procedure of forming conductive layer 8 at the current controlling unit and metal layer 2 of fixing portion described above, formation of the intervening layer provided between ceramic base plate 1 and conductive layer 8 and formation of intervening layer provided between ceramic base plate 1 at the fixing portion and metal layer 2 can be performed basically simultaneously even when any of copper, aluminum and nickel is selected for the conductive layer of the current controlling unit and any of copper, aluminum and nickel is selected for the metal layer of the fixing portion, whereby manufacturing steps can be simplified.

Further, a metal film containing, as a main component, copper, aluminum or nickel is sometimes formed on the rear surface of the ceramic base plate for the power module board, that is, on the surface which faces the heat radiating plate 5, in accordance with the present embodiment. In that case, this metal film may be formed simultaneously with the above described layers.

Therefore, when the pattern of the metal layer 2 at the fixing portion is formed such as shown in FIGS. 2A to 2F, for example, the metal layer and the ceramic base plate 1 are bonded in thermally and mechanically sufficient state of bonding, and therefore particularly thermally sufficient connection can be attained as compared when the fixing portion is fixed by simply inserting a metal washer 16 or the like. The pattern shapes of metal layer 2 will be described later.

Further, the metal layer is well compatible physically with respect to the fixing equipments (bolt, clamp head or fixing jig), and therefore better adhesion can be attained.

From the foregoing, efficiency of thermal conduction from ceramic base plate 1 to the fixing jig can significantly be improved.

A material containing, as a main component, copper, aluminum or nickel may be used as the material of metal layer 2. As the material of ceramic base plate 1, any electrically insulating ceramics having high thermal conductivity such as aluminum nitride ceramics and silicon nitride ceramics may be used.

As the material of heat radiating plate 5, a material containing, as a main component, copper or aluminum may be used. Preferably, a thin metal film 11 may be formed as shown in FIG. 1 between radiating plate 5 and ceramic base plate 1.

When aluminum nitride ceramics or silicon nitride ceramics is used as the material of ceramic base plate 1, after a brazing layer including active metal or a metalized layer including a metal having high melting point is used, a nickel plating layer is formed thereon. This improves adhesiveness at the interface between metal film 11 and heat radiating plate 5, and improves wetting property of ceramic base plate 1 with silicon oil compound, if used. Accordingly, heat resistance at the interface can be decreased.

Figure 3:
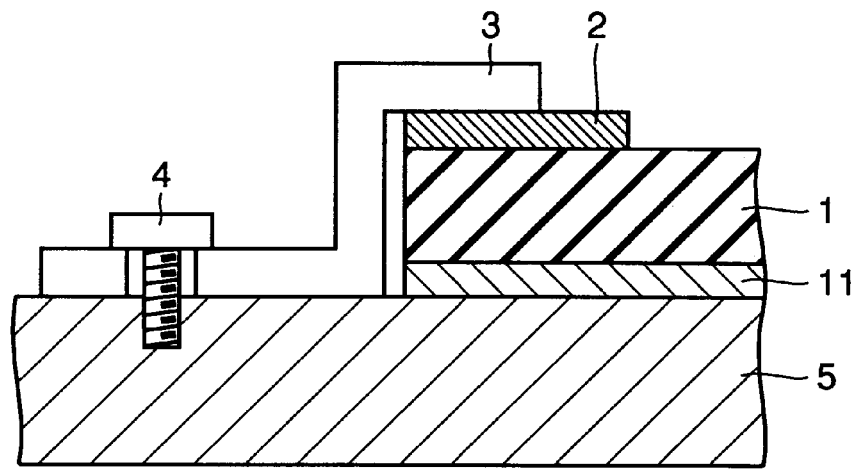
FIG. 3 is a cross section representing a structure of a fixing portion when the ceramic base plate is fixed by a fixing jig in accordance with an embodiment of the present invention.

Referring to FIG. 3, an example in which ceramic base plate 1 is fixed by using fixing jig 3 will be described. When fixing jig 3 is clamped by a bolt 4 with ceramic base plate 1 warped, stress concentrates at the corner of ceramic base plate 1 or the corner of fixing jig 3 and cracks generate in ceramic base plate 1, unless there is a copper layer.

When copper is used as metal layer 2, for example, stress concentration is relaxed by deformation of copper, and hence generation of cracks in ceramic base plate 1 can be prevented. Even when ceramic base plate 1 warps because of difference in coefficients of thermal expansion as the temperature increases because of heat at the bonding portion while the IGBT chip 6 is in operation, stress concentration can be relaxed by deformation of copper, and generation of cracks in ceramic base plate 1 can be prevented, when the copper layer is provided. Further, vibration can be absorbed when the module is mounted on a vehicle, and therefore damage or degradation of ceramic base plate 1 can be prevented.

Further, as the fixing portion structure formed of a copper layer is provided in accordance with the present embodiment described above, heat resistance from ceramic base plate 1 to fixing jig 3 is reduced, and hence radiation from ceramic base plate 1 to heat radiating plate 5 is improved. In order to improve radiation from fixing jig 3, a composite material using copper or aluminum as a core material and steel as a material of the outer periphery of fixing jig 3 may be used.

When ceramic base plate 1 warps as it is fixed by bolt 4, or the ceramic material 1 warps because of difference in coefficients of thermal expansion when IGBT chip 6 is heated, ceramic base plate 1, which is fragile, may be damaged if the corner of the ceramic base plate 1 is brought into contact with heat radiating plate 5 or fixing jig 3. Further, when the corner hits somewhere during handling for assembly, the ceramic base plate 1 may be damaged. Therefore, the ceramic base plate 1 has its corners chamfered with R1 being in the range of 0.05 mm to 0.2 mm, or with C1 being in the range of 0.05 mm to 0.2 mm, preferably. Further, the corner at which fixing jig 3 is in contact with metal layer 2 should also be chamfered to have R2 or C2 of 0.05 mm to 0.2 mm.

Further, in order to prevent damage caused by contact between the side surfaces of ceramic base plate 1 and fixing jig 3 because of impact, vibration or inappropriate handling during assembly, there should preferably be a gap between the side surfaces of ceramic base plate 1 and fixing jig 3. The amount of gap t1 is, preferably, in the range of 0.0025 L to 0.01 L, where L represents the length of the ceramic base plate 1.

Further, in order to prevent damage caused by contact between the side surfaces of ceramic base plate 1 and fixing jig 3 because of impact, vibration or inappropriate handling during assembly, surface roughness Ra of an end surface of ceramic base plate 1 should preferably have no protrusion exceeding 50 $\mu$m. Further, in order to ensure sufficient contact between bolt 4 and fixing jig 3 to decrease heat resistance, surface roughness of the front and rear surfaces of ceramic base plate 1 where metal layer 2 is formed should preferably be at most 2 $\mu$m.

Figure 6:
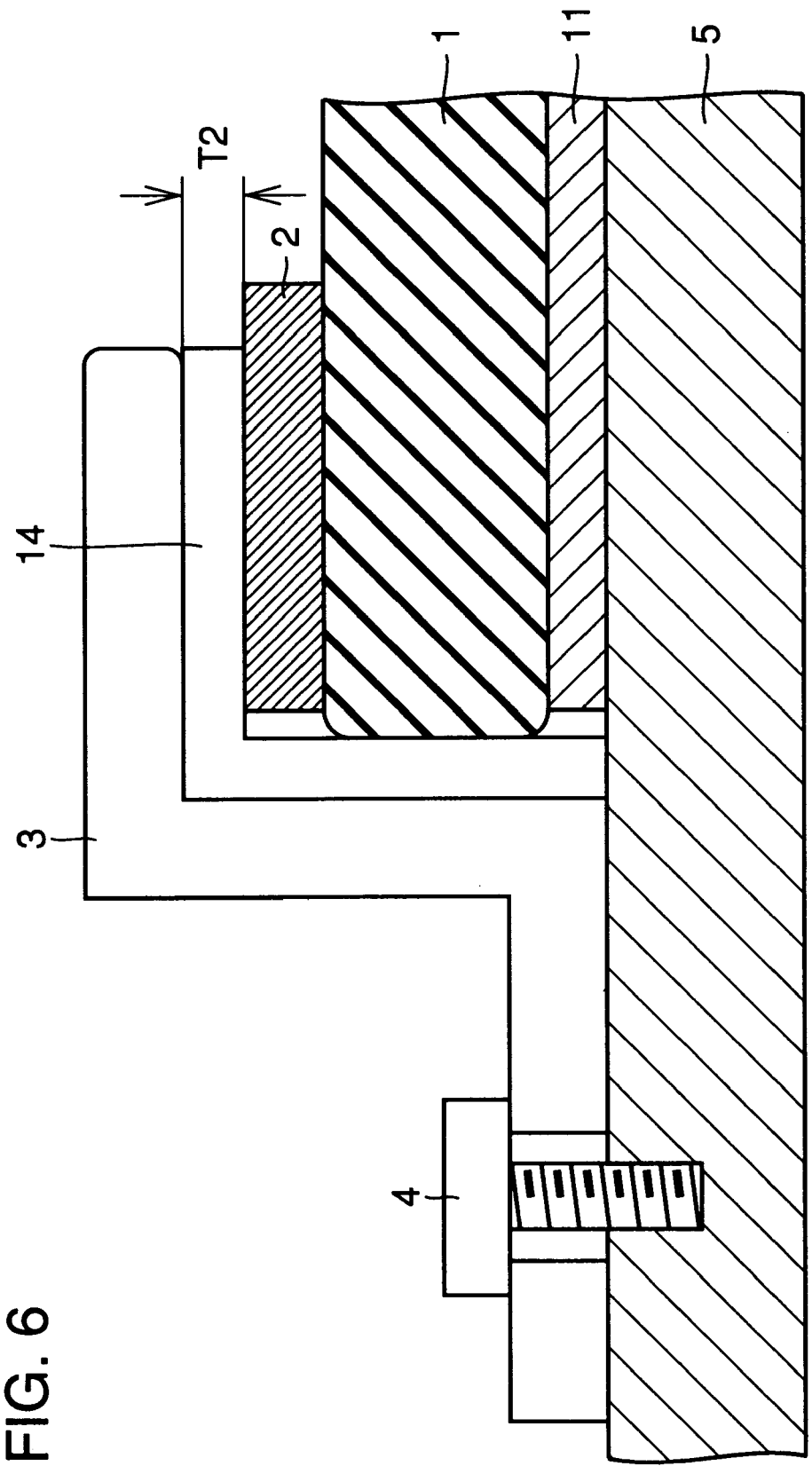
FIG. 6 is a second cross section representing a detailed structure of the fixing portion when the ceramic base plate is fixed by the fixing jig in accordance with an embodiment of the present invention.

In order to relax stress caused by warping of the ceramic base plate 1 derived from thermal stress, to absorb shock and vibration and to conduct heat, the thickness T1 of metal layer 2 should preferably be in the range of 0.015 to 1.0 mm. Further, the stress can be more relaxed and radiation can be improved when a heat radiation sheet 14 having the thickness T2 of 0.5 mm to 3.0 mm is interposed, as shown in FIG. 6.

Figure 4:
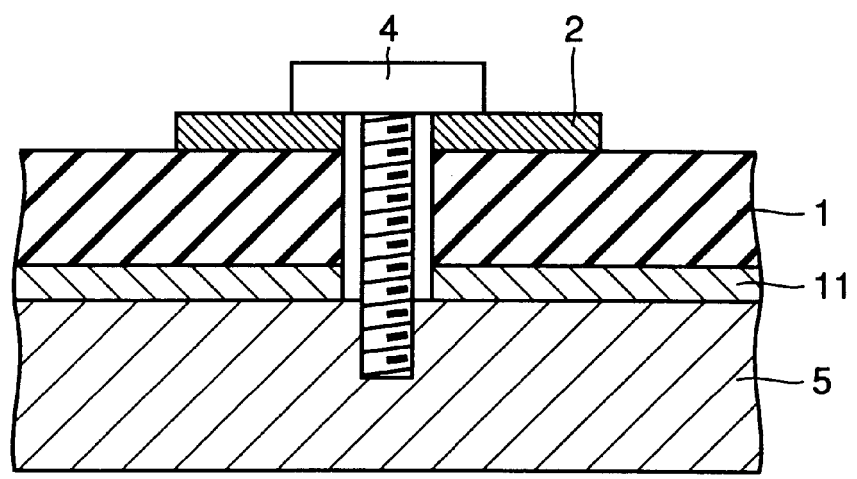
FIG. 4 is a cross sectional view representing a structure of a bolt hole portion when the ceramic base plate is fixed by a bolt, in accordance with an embodiment of the present invention.

Referring to FIG. 4, fixing of ceramic base plate 1 by using bolt 4 will be described. In this case, when ceramic base plate 1 is warped or when the ceramic base plate 1 warps as the temperature increased, cracks can be prevented by the provision of metal layer 2, as described with reference to FIG. 3.

Here, even when ceramic base plate 1 is not warped, stress concentrates at that portion of ceramic base plate 1 which corresponds to the corner of bolt 4, if the bolt 4 is clamped with excessive force, resulting in cracks. In this case also, by forming a metal layer 2 as shown in FIG. 4, stress concentration can be relaxed, and shock and vibration can be absorbed. Therefore, cracks or chipping of ceramic base plate 1 can be prevented.

Further, as heat resistance from ceramic base plate 1 to bolt 4 is reduced because of this metal layer 2, heat radiation from ceramic base plate 1 to heat radiating plate 5 through bolt 4 can be improved. In order to improve radiation from bolt 4, as already mentioned with respect to fixing jig 3 shown in FIG. 3, a composite material using copper, aluminum or the like as the core material may be used for bolt 4.

Figure 7:
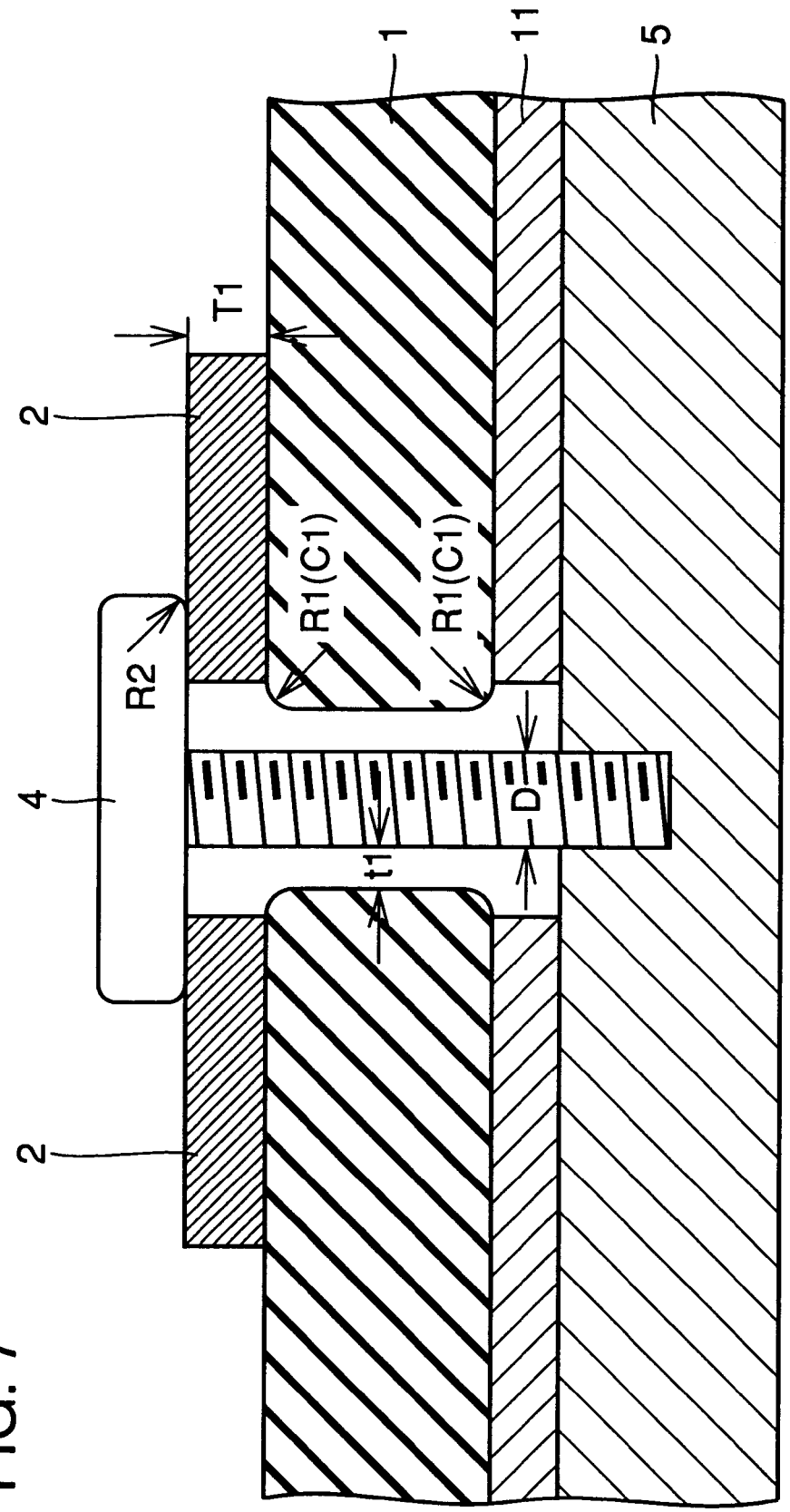
FIG. 7 is a first cross section representing a detailed structure of a bolt hole portion when the ceramic base plate is fixed by a bolt in accordance with an embodiment of the present invention.

Here, when the bolt is clamped too tight, or when the ceramic base plate 1 warps because of difference in coefficients of thermal expansion when IGBT chip 6 is heated, ceramic base plate 1, which is fragile, may be damaged if the corner of ceramic base plate 1 is brought into contact with heat radiating plate or bolt 4. Further, if the corner hits somewhere during handling for assembly, the ceramic base plate 1 may be damaged. Therefore, the corners of ceramic base plate 1 should preferably be chamfered with R1 being in the range of 0.05 mm to 0.2 mm or C1 being in the range of 0.05 mm to 0.2 mm, as shown in FIG. 7. Further, corners of bolt 4 at which bolt 4 contacts metal layer 2 should preferably be chamfered with R2 or C2 in the range of 0.05 mm to 0.2 mm.

Further, in order to prevent damages or cracks as ceramic base plate 1 and bolt 4 are brought into contact by shock, vibration or inappropriate handling during assembly, a gap should preferably be ensured between a side surface of ceramic base plate 1 and bolt 4. The amount of gap t1 should preferably be in the range of 0.05 D to 0.25 D, where D represents diameter of bolt 4. The surface roughness Ra of the inner surface of bolt hole 1A should preferably has no protrusion exceeding 50 $\mu$m. The thickness T1 of metal layer 2 should preferably be in the range of 0.15 mm to 1 mm.

Figures 8, 9:
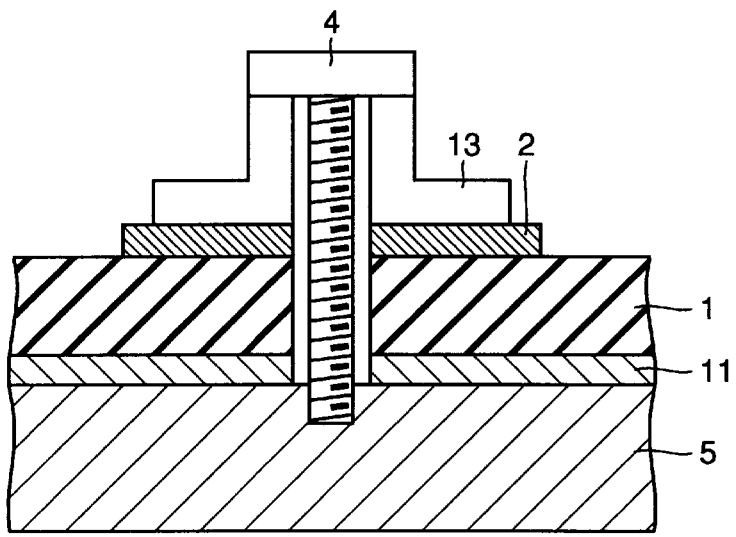
FIG. 8 is a second cross section representing a detailed structure of the bolt hole portion when the ceramic base plate is fixed by the bolt in accordance with an embodiment of the present invention.
FIG. 9 shows thermal conductivity and coefficient of expansion of representative materials introduced in an embodiment of the present invention.

When fixing is attained by bolt 4, it is possible to disperse pressure on metal layer 2 uniformly and widely, if the area of metal layer 2 is enlarged and an inverted T-shaped metal jig 13 is interposed between bolt 4 and metal layer 2, as shown in FIG. 8. As a result, thermal stress and mechanical stress-vibration can more effectively be absorbed.

Here, in order to prevent contact between metal jig 13 and metal layer 2 because of shock, vibration or inappropriate handling during assembly, causing damages of cracks of metal layer 2 or ceramic base plate 1, corners of metal jig 13 which is in contact with metal layer 2 should be chamfered with R or C being in the range of 0.05 mm to 0.2 mm.

Further, when fixing is attained by a clamp (not shown), a structure which facilitates exchange of a power module can be provided. In this case, a metal layer is formed at a portion where the clamp abuts.

In any case, when ceramic base plate 1 is warped, ceramic base plate 1 may be damaged or cracked when the base plate is fixed by a bolt 4, a fixing jig 3 or a clamp. In order to prevent such damage, warpage of ceramic base plate 1 should desirably be at most 3 L $\mu$m, where the length is Lmm. Further, in order to prevent damages or cracks caused when the corner hits because of shock, vibration or inappropriate handling during assembly, chamfering should be provided with R3 or C3 being in the range of 0.5 mm to 2 mm when viewed from above (see FIG. 2).

Figure 2A:
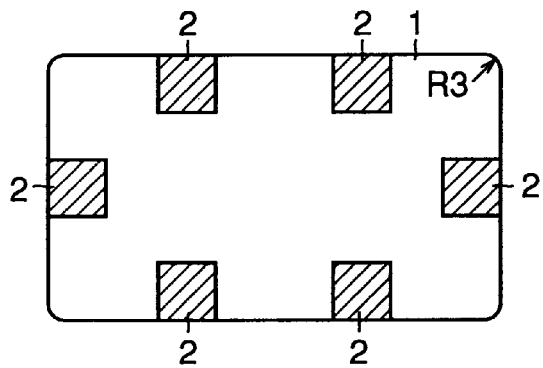
FIGS. 2A to 2F are plan views representing patterns of metal layer 2.
Figure 2B:
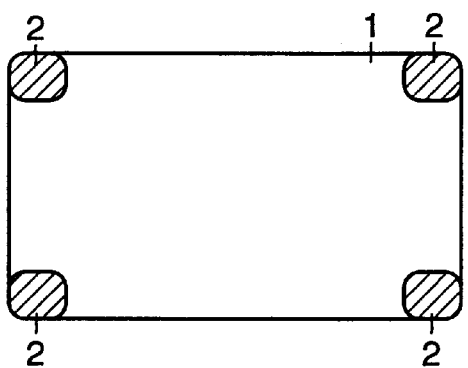
Figure 2C:
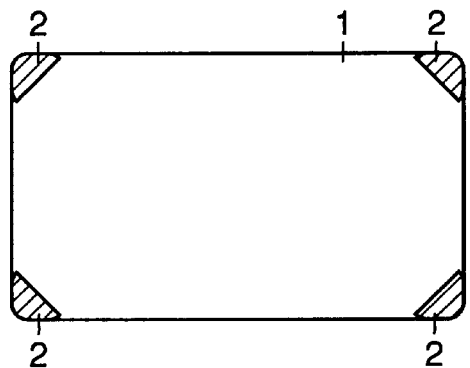
Figure 2D:
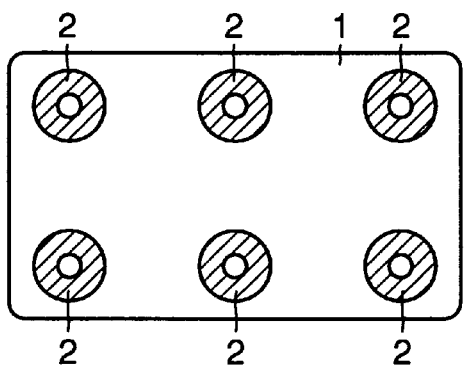
Figure 2E:
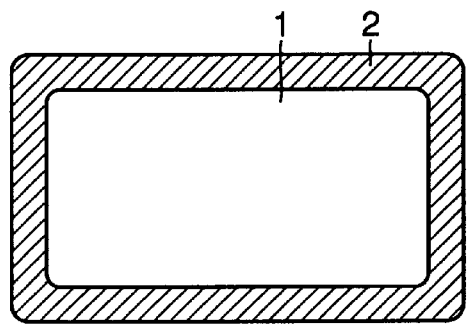
Figure 21:
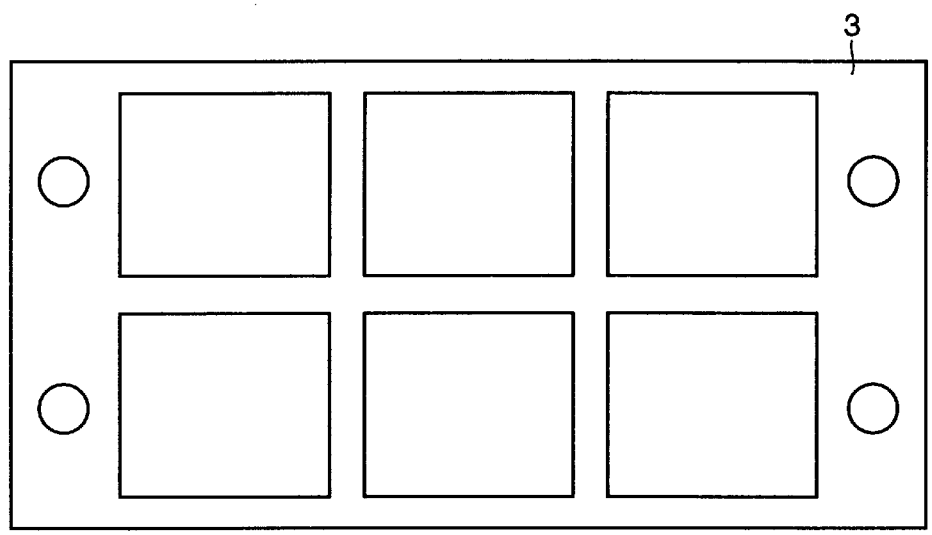
FIG. 21 is a plan view of a net shaped fixing jig.

FIGS. 2A to 2F and 20A to 20F show exemplary patterns of the metal layer 2. For convenience, metal layers 2 are represented by hatched portions. FIGS. 2A to 2C and 2E and, 20A to 20C and 20E are patterns when fixing jig 3 of the type shown in FIG. 3 are used. FIGS. 2D and 20D are patterns when fixing is attained by bolt 4 shown in FIG. 4. FIGS. 2E and 20E are patterns when a clamp is used. For the pattern of FIG. 20E, fixing may be attained by a net shaped fixing jig 3 such as shown in FIG. 21.

Referring to FIGS. 2A to 2F and 20A to 20F, when ceramic base plate 1 is directly fixed on heat radiating plate 5 by bolt 4, a margin such as shown in FIG. 2D or FIG. 20D may be provided at an appropriate position of the pattern of metal layer 2 and a hole may be opened at that portion.

Figure 2F:
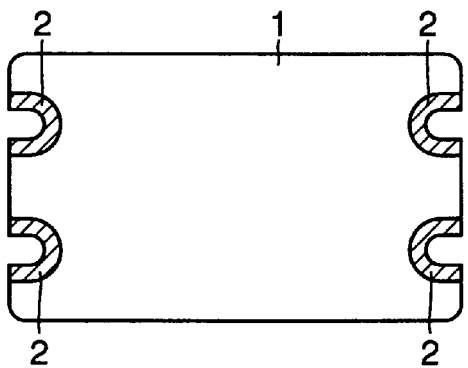

Further, ceramic base plate 1 may be partially cut to have U-shaped portion as shown in FIG. 2F or FIG. 20F, so that the base plate can be fixed by means of a clamp or bolt. Various other known means for fixing may be available.

FIG. 9 shows thermal conductivity and coefficients of thermal expansion of representative materials introduced in the present embodiment.

(EXAMPLE 1)

As main component powder, aluminum nitride powder (AlN) having mean grain diameter of 1.0 $\mu$m, or silicon nitride powder ($Si_3N_4$), $Y_2O_3$ powder having mean grain diameter of 0.06 $\mu$m, and CaO powder having mean grain diameter of 0.3 $\mu$m were determined to occupy 97 wt %, 1.5 wt % and 1.5 wt %, respectively, mixed uniformly for 24 hours by a ball mill in ethanol solution, and AlN base mixed powder and $Si_3N_4$ base mixed powder, both having $Y_2O_3$—CaO as sintering assisting agent were obtained.

Further, to 100 parts by weight of each of these mixed powders, 10 parts by weight of PVB was added as a binder, and slurry was obtained. Part of the slurry was spray-dried, molded by powder molding press, and through holes were provided by machining at four corners.

Metal W having high melting point and mean grain diameter of 1 $\mu$m was added little by little to a mixture of 10 wt % of a solvent, 5 wt % of $SiO_2$—CaO—$B_2O_3$ based glass and 5 wt % of organic binder by a ball mill, to attain the viscosity of 200 ps, and thus paste of metal having high melting point was prepared. The paste of metal having high melting point was applied by printing using a 200 mesh screen on one main surface of each of the molded bodies, at a portion of 15 mm square on which a conductive layer for current control is to be placed finally and at portions around a hole of 9 mm in diameter at which a metal layer for the fixing portion is to be placed finally, by the width of 3 mm. Further, the paste of metal having high melting point was also applied entirely over the rear surface, and the resulting molded bodies were sintered for 5 hours at 1700° C. in a nitrogen atmosphere. Thus various molded bodies were sintered and the paste of metal having high melting point was printed (co-fire metalized method).

Metalized AlN ceramic base plates and metalized $Si_3N_4$ ceramic base plates having metalization layers of W high melting point obtained through the above described steps (hereinafter referred to as "W layers") each had the width of 50 mm, length of 50 mm and thickness of 3 mm, relative density of the sintered bodies (ratio of actually measured submerged density with respect to theoretical density of 100%) was 99%, and defects such as holes which would present problems in actual use were not observed.

The resulting aluminum nitride ceramics and silicon nitride ceramics had thermal conductivities of 160 W/m.K and 100 W/m.K, 3 point bending strengths of 40 kg/mm$^2$ and 155 kg/mm$^2$ and coefficients of thermal expansion of 4.3×10$^{-6}$/° C. and 3.2×10$^{-6}$/° C., respectively.

Ten samples were selected for each material, nickel-phosphorus plating was applied on the metalization layer of metal having high melting point, and the plating layer was sintered for 30 minutes at 600° C. in a nitrogen atmosphere. Defects such as bulging or separation was not observed on the resulting metal intervening layers. Plating thicknesses of the samples were all within the range of 6±2 μm. Here, circular metal layers such as represented by the hatched portions of FIG. 2D were formed around through holes at four corners as fixing portions of ceramic base plate 1.

On the surface of each of these boards, an electrolytic copper material in compliance with JIS C1020 was placed as a conductive layer of 11 mm square and having the thickness of 0.3 mm, on the W layer. The samples were placed on a graphite setter, and bonding was performed in a furnace without any load, for 30 minutes at 970° C. in nitrogen air flow.

In this manner, ceramic base plates each having a copper layer formed at four corners and a center of the main surface without any portion protruding from the W layer at any position on the surface of the bonded body were obtained (a sample formed of aluminum nitride ceramics will be referred to as A1, and a sample formed of silicon nitride ceramics will be referred to as A2.)

Including these, in the following, the ceramic base plate with a copper layer formed on its surface will be referred to as "copper circuit bonded board."

Nickel plating of 2 μm was formed to prevent oxidation of copper, on the copper of each copper circuit bonded board.

In the same step, nickel plating of 2 μm was provided on the W layer of the rear surface additionally. Samples were subjected to ultrasonic inspection at the time of bonding, and defects were not observed.

Thereafter, cross sections after bonding were inspected by SEM (Scanning Electron Microscope) of 1000 in magnitude, and cracks and pinholes were not observed at the interface.

For comparison, samples of aluminum nitride ceramics and silicon nitride ceramics not provided with copper layers around the holes at four corners and not provided with the nickel layer on the rear surface were fabricated. (A sample of aluminum nitride ceramics will be referred to as B1, and a sample of silicon nitride ceramics will be referred to as B2.)

Samples of thus formed two types of copper circuit bonded boards and two types of ceramic base plates were fixed on an aluminum block by using M6 bolts formed of steel, and torque at which cracks generated was measured. In a ceramic base plate not having the copper layer around the bolt hole (corresponding to a conventional product), cracks were generated at the torque of 130 kgf.cm or more. In the structure in accordance with the present invention having the copper layer around the bolt hole (copper circuit bonded board), cracks were not generated up to the torque of 200 kgf.cm.

(EXAMPLE 2)

Samples of aluminum nitride ceramic without any bolt hole, having a copper layer of 9.5 mm square at each side and a copper conductive layer of 19.5 mm square at the center of a board of 50 mm square were manufactured under the same manufacturing condition as Example 1.

Similar to Example 1, Ni plating layer of 2 μm was formed on the rear surface of each sample. For comparison, samples of the prior art having the copper conductive layer of 19.5 mm square at the center only were fabricated.

Clamp test was performed using the method of fixing of the type shown in FIG. 3, with a fixing jig of which bonding portion with the ceramic base plate 1 was 8 mm square. Bolts used were the same as the bolts used in Example 1. In the samples of the prior art not having the copper layer at the contact portion with the fixing jig, cracks were generated at the clamping torque of 150 kg.cm or more. Meanwhile, in the structure in accordance with the present invention having the copper layer at the contact portion, cracks were not observed up to the torque of 220 kg.cm.

(EXAMPLE 3)

Using the samples of bolt fixing of Example 1, heat cycle test was performed. Samples A1 and A2 of aluminum nitride ceramics and silicon nitride ceramics in accordance with the embodiment of the present invention having copper layers and samples B1 and B2 of the prior art without the copper layer were subjected to 1000 heat cycles, with each cycle consisting of −50° C. for 15 minutes and 150° C. for 15 minutes. Cracks were not generated in samples A1 and A2, while cracks were generated from portions where corners of the bolt abut in samples B1 and B2. Similar results were observed on the samples in accordance with the present invention and the prior art when the fixing jig of Example 2 were used.

(EXAMPLE 4)

On the copper conductive layers of aluminum nitride ceramic base plate and silicon nitride ceramic base plate fabricated under the same conditions as Example 1, an IGBT chip and a diode were fixed by solder, cases were fabricated by resin mold on respective base plates, control boards were fixed thereon, and resin leads were attached, whereby power modules were fabricated. The power modules were fixed on an aluminum heat radiating plate by bolts, and subjected to 1000 heat cycles, each cycle consisting of −50° C. for 15 minutes and 150° C. for 15 minutes. Cracks were not observed in either of the base plates.

(EXAMPLE 5)

Figure 24:
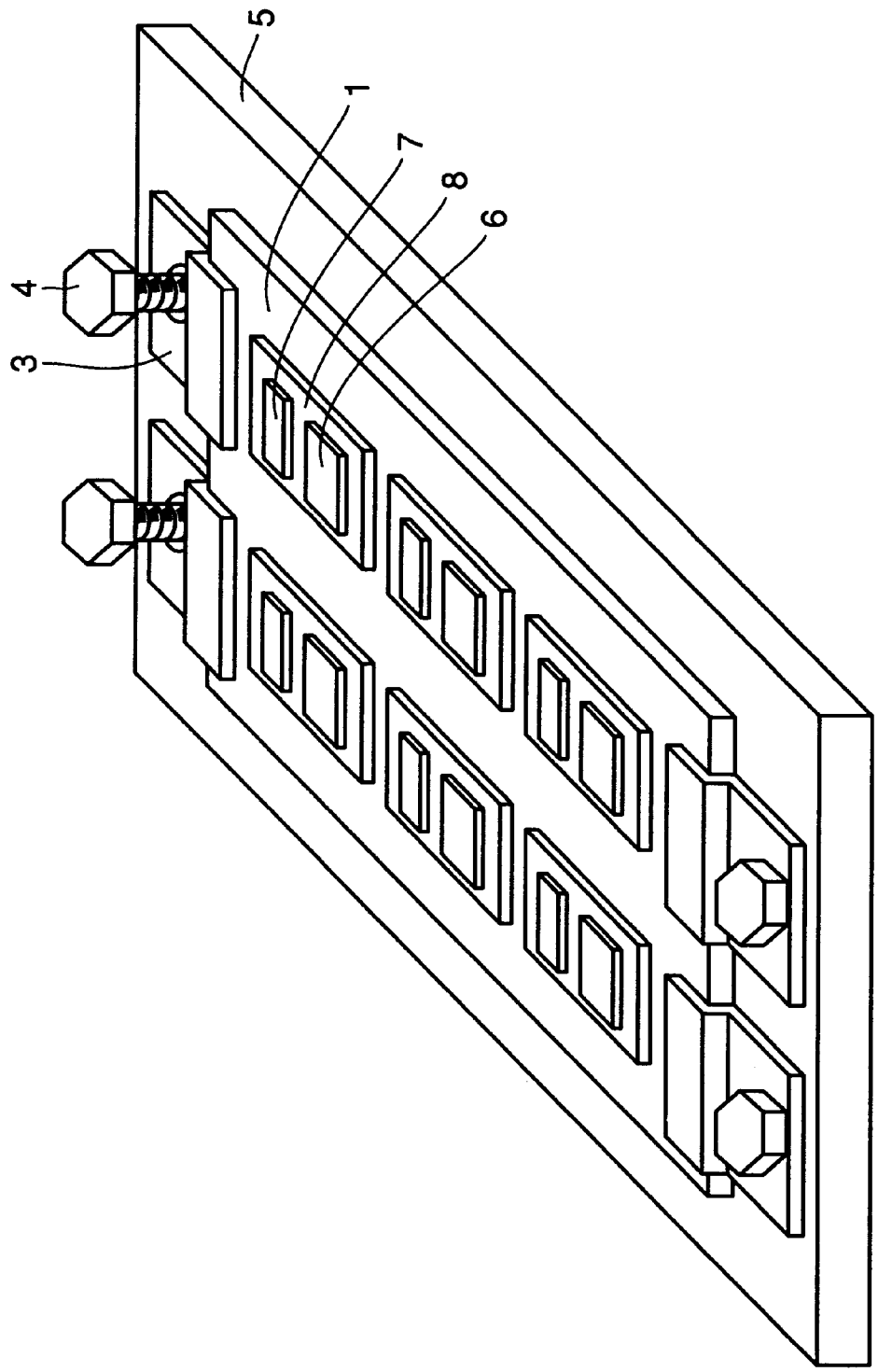
FIG. 24 is a perspective view representing a conventional method of fixing when the ceramic base plate is fixed by fixing jigs.

Copper circuit bonded boards having ceramic boards of the structure shown in FIGS. 10 and 24 were fabricated. As ceramic base plate 1, molded bodies of ceramic base plates were fabricated from AlN slurry and $Si_3N_4$ slurry, through the same method as Example 1.

On six portions of one main surface of each of the molded bodies, that is, portions of 14 mm×30 mm on which the conductive layer for current control is to be placed finally and areas of the width of 9.5 mm on opposing short sides of the molded body on which the metal layers for fixing portions are to be placed finally (see FIG. 20A), the paste of metal having high melting point was applied and printed in the similar manner as in Example 1, and the paste of the metal having high melting point was also applied to the entire rear surface. The resulting molded bodies were sintered for 5 hours at 1700° C. in a nitrogen atmosphere, and the molded bodies were sintered and the paste of metal having high melting point were printed (co-fire metalize method).

The metalized AfN ceramic base plates and the metalized $Si_3N_4$ ceramic base plates having the metalization layer of W metal having high melting point obtained through the above described steps each had the width of 75 mm, length of 150 mm and the thickness of 2 mm, relative density of the sintered bodies (the ratio of actually measured solid density with respect to theoretical density of 100%) was 99%, and defects such as holes which would be problems in actual use were not observed on the surface. The resulting aluminum nitride ceramic base plates and silicon nitride ceramic base plates had thermal conductivities, three point bending strengths and coefficients of thermal expansion approximately equal to those of Example 1.

Ten samples were selected for each material, nickel-phosphorus plating was provided on the metalized surface of metal having high melting point, the resulting samples were subjected to heat treatment for 30 minutes at 600° C. in a nitrogen atmosphere, and the plating layers were sintered. Defects such as bulging and separation were not observed in the resulting metal intervening layers. Further, plating thicknesses of the samples were all in the range of 6±2 µm.

Six electrolytic copper materials in compliance with JIS C1020 each having the length of 14 mm, width of 28 mm and thickness of 0.3 mm were placed as conductive layers on the W layer on the surfaces of the base plates, and copper materials each having the length of 9 mm, width of 75 mm and the thickness of 0.3 mm were placed on opposing short sides, as metal layers at the fixing portions. Further, an electrolytic copper material of 75 mm×150 mm, similar to that placed on the front surface, was provided on the rear surface, the plates were placed on a graphite setter, and subjected to bonding in a furnace without any load, for 30 minutes 970° C. in a nitrogen gas flow.

In this manner, copper circuit bonded boards each having copper layers formed at six portions and opposing short sides on the main surface and entirely on the rear surface with nickel posed as an intervening layer, with the copper plate not protruding from W layer at any portion of the surface of the bonded bodies were obtained. Nickel plating of 2 µm was formed to prevent oxidation of copper, on the copper layers of the copper circuit bonded boards.

The samples were subjected to ultrasonic inspection at the time of bonding, and defects were not observed. Further, cross sections after bonding were inspected by SEM (Scanning Electron Microscope) at 1000 magnification and cracks, pinholes and the like were not observed at the interface.

As fixing jigs, ten fixing jigs (type 1) for fixing opposing short sides of the copper circuit bonded board at contact portions of 8 mm×15 mm, such as shown in FIG. 24, and ten fixing jigs (type 2) for fixing four corners of the copper circuit bonded board at contact portions of 8 mm in width such as shown in FIG. 10 were formed by aluminum.

An aluminum base (100 mm×200 mm×t20 mm) with four bolt holes for fixing was prepared, and copper circuit bonded boards of aluminum nitride ceramics and silicon nitride ceramics were fixed by fixing jigs of types 1 and 2, five boards by five boards, respectively. Silicon oil compound was applied between the base and each copper circuit bonded board.

The samples fabricated in this manner were subjected to impact test with the impact applied in a direction perpendicular to the longer side. Four samples of copper circuit bonded board of aluminum nitride ceramics and four samples of copper circuit bonded board of silicon nitride ceramics were displaced and slipped out of the fixing jigs of type 1. No copper circuit bonded board of aluminum nitride ceramics or silicon nitride ceramics was displaced from the fixing jigs of type 2.

(EXAMPLE 6)

Copper circuit bonded boards of the ceramic base plate divided type having the structure shown in FIGS. 12 and 14 were fabricated. Samples of ceramic base plate 1 were fabricated from the AlN slurry and $Si_3N_4$ slurry, through the same method as Example 1. Under the same manufacturing condition as Example 1, copper circuit bonded boards having the width of 20 mm, length of 100 mm and thickness of 2 mm formed of aluminum nitride ceramics with copper conductive layers 8 having the length of 14 mm, width of 29 mm and thickness of 0.3 mm at 3 portions on the main surface and copper layers of 8 mm in width at opposing short sides were fabricated. A nickel layer of 0.2 µm was formed on the W layer on the rear surface of each board.

In place of IGBT chip 6, a ceramic heater (hereinafter referred to as "heater") of 10 mm square was fixed by solder on conductive layer 8, and a thermocouple (not shown) was placed on an upper surface of the heater.

Fixing jig 3 (type 3) for fixing four corners of two ceramic base plates 1 (20 mm×100 mm×t2 mm) shown in FIG. 12 simultaneously were fabricated. Four bolt holes were formed in an aluminum heat radiating plate 5 (100 mm×200 mm×t2 mm), and two copper circuit bonded boards were fixed by fixing jig 3 of type 3.

For comparison, heaters were fixed by solder on conductive layers of the copper circuit bonded board (75 mm×150 mm×t2 mm) shown in FIG. 10 of Example 5 in the similar manner, a thermocouple was placed on the upper surface of the heater, and the board was fixed by fixing jig 3 of type 2.

Power of 100 W was fed to the heaters of these boards, and temperature was measured by the thermo couples placed on the surfaces of the heaters. The heater surfaces had the surface temperature of 125° C. The volume of the ceramic base plate in accordance with the present embodiment can be reduced by 35% as compared with the ceramic base plate of Example 5. Therefore, significant reduction in volume enables reduction in cost of the ceramic base plate.

Generally, when an area of a heat spreader is made small, diffusion of heat in the lateral direction reduces, and the temperature of the heat source increases. In this example, the temperature was not increased even when the area of the ceramic base plate is reduced, because the ceramic base plate was divided so that the influence of adjacent IGBT chip 6 (in the present example, heaters) can be eliminated, and because the length of the ceramic base plate was made shorter, so that warpage of the ceramic base plate caused by the heat from IGBT chip 6 (in the present example, heaters) could be reduced, resulting in lower heat resistance.

Further, a copper circuit bonded board was fabricated having a copper plate of 0.3 mm thickness bonded on the entire rear surface, when the copper conductive layer was bonded to the main surface of ceramic base plate 1 in accordance with the present embodiment. The same measurement as described above was conducted on the copper circuit bonded board, and the heater surface temperature was 123° C., that is, 2° C. lower. The reason is as follows. As the copper plate was bonded to the front and rear surfaces of the ceramic base plate, stress derived from difference in coefficients of thermal expansion between ceramic base plate 1 and copper plates generated when the heater (corresponding to IGBT chip 6) was heated was canceled, reducing warpage, and hence the heat resistance is reduced.

Further, a ceramic base plate of which thickness was reduced from 2 mm of the ceramic base plate 1 of the present example to 1 mm was fabricated and the similar measurement was performed. The heater surface temperature was 126° C., that is, the increase was only 1° C. By making thinner the ceramic base plate, the cost of the ceramic base plate can further be reduced.

FIG. 16 shows an example in which two copper circuit bonded boards were fixed by using fixing jig 3 (type 3') in which two fixing jigs (type 3) are integrated. Though the surface temperature of the heater (corresponding to the temperature of IGBT chip 6) is not changed in this example, assembly can be facilitated.

Though examples of copper circuit bonded boards formed of aluminum nitride ceramics have been described, similar results could be obtained for the copper circuit bonded boards formed of silicon nitride ceramics.

(EXAMPLE 7)

Copper circuit bonded board of the ceramic base plate divided type having the structure shown in FIG. 15 was fabricated. Ceramic base plates were formed from AlN slurry and $Si_3N_4$ slurry through the same method as in Embodiment 1. Under the same manufacturing condition as in Example 1, copper circuit bonded board of aluminum nitride ceramics having the length of 20 mm, width of 70 mm and thickness of 2 mm having copper conductive layers each having the length of 14 mm, width of 29 mm and the thickness of 0.3 mm formed at two portions on the main surface and copper layers of 8 mm in width formed at opposing shorter sides was formed. As in Example 6, a copper layer was formed on the rear surface.

In place of IGBT chip 6, a ceramic heater (hereinafter referred to as "heater") of 10 mm square was fixed by solder on each conductive layer 8, and a thermocouple was placed on the upper surface of the heater.

A fixing jig 3 (type 4) for fixing four corners of three ceramic base plates 1 (70 mm×20 mm×t2 mm) shown in FIG. 15 simultaneously was formed. Four bolt holes for fixing were formed in an aluminum plate (100 mm×200 mm×t2 mm) as heat radiating plate 5, and the aforementioned three copper circuit bonded boards were fixed by type 4 fixing jig 3.

For comparison, a heater was fixed by solder on each conductive layer 8 of copper circuit bonded board (75 mm×150 mm×t2 mm) shown in FIG. 10 of Example 5 in the similar manner, a thermocouple was placed on the upper surface of the heater, and the board was fixed by type 2 fixing jig 3.

The power of 100 W was applied to the heaters of these boards, and the temperature was measured by the thermocouples placed on the surfaces of the heaters. In both samples, the heaters had the surface temperature (corresponding to the temperature of IGBT chip 6) of 125° C. The volume of the ceramic base plate in accordance with the present example can be reduced by 37% as compared with the ceramic base plate of Example 5. When compared with Example 6, the effect of reducing raw material cost is comparable. It should be noted that the shape of the ceramic base plate is made compact, and hence production yield in fabricating the ceramic base plate can be improved, and as a whole, the cost can be reduced.

Though samples of copper circuit bonded boards formed of aluminum nitride ceramics have been described, similar results could be obtained for copper circuit bonded boards formed of silicon nitride ceramics.

(EXAMPLE 8)

The copper circuit bonded board of ceramic base plate divided type having the structure shown in FIG. 17 was fabricated. Ceramic base plates were formed from AlN slurry and $Si_3N_4$ slurry through the same method as in Example 1. Under the same manufacturing condition as Example 1, copper circuit bonded board of aluminum nitride ceramics having the length of 32 mm, width of 21 mm and the thickness of 2 mm and a copper conductive layer having the length of 14 mm, width of 29 mm and the thickness of 0.3 mm formed on the main surface and copper layers 8 mm in width formed on opposing shorter sides was fabricated. As in Example 6, a copper layer was formed on the entire rear surface.

In place of IGBT chip 6, a ceramic heater (hereinafter referred to as "heater") of 10 mm square was fixed by solder on conductive layer 8, and a thermocouple was placed on the upper surface of the heater.

A fixing jig 3 (type 5) for fixing four corners of six ceramic base plates 1 (21 mm×32 mm×t2 mm) shown in FIG. 17 simultaneously was fabricated. Four bolt holes for fixing were formed in an aluminum plate (100 mm×200 mm×t10 mm) as heat radiating plate 5, and six copper circuit bonded boards were fixed by type 5 fixing jig 3.

Figure 5:
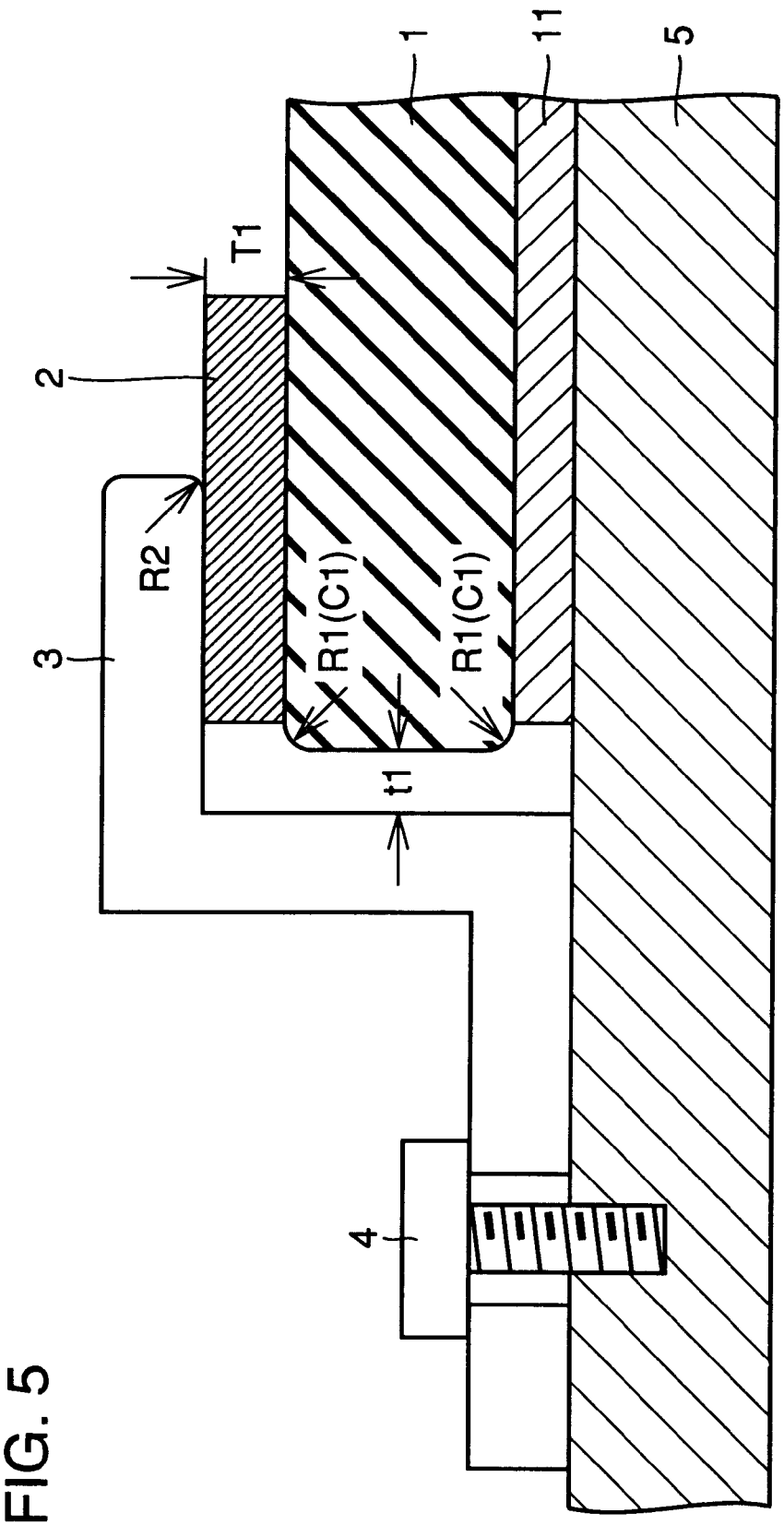
FIG. 5 is a first cross section representing a detailed structure of the fixing portion when the ceramic base plate is fixed by a fixing jig in accordance with an embodiment of the present invention.

For comparison, a heater was fixed by solder on the conductive layer 8 of copper circuit bonded board (75 mm×150 mm×t2 mm) shown in FIG. 5 of Example 5, a thermocouple was placed on the upper surface of the heater and the board was fixed by type 2 fixing jig 3.

The power of 100 W was fed to both heaters, and the temperature was measured by the thermocouple placed on the surfaces of the ceramic heaters. As a result, it was found that the heater surface temperatures (corresponding to the temperature of IGBT chip 6) were the same, that is, 125° C. The volume of ceramic base plate of the present example can be reduced by 54% as compared with the ceramic base plate of Example 5.

When compared with Examples 6 and 7, the effect of reducing raw material cost is not so significant. However, as the shape of the ceramic base plate can further be made compact, production yield in manufacturing the ceramic base plate can be improved and overall cost can be reduced.

Figure 18A:
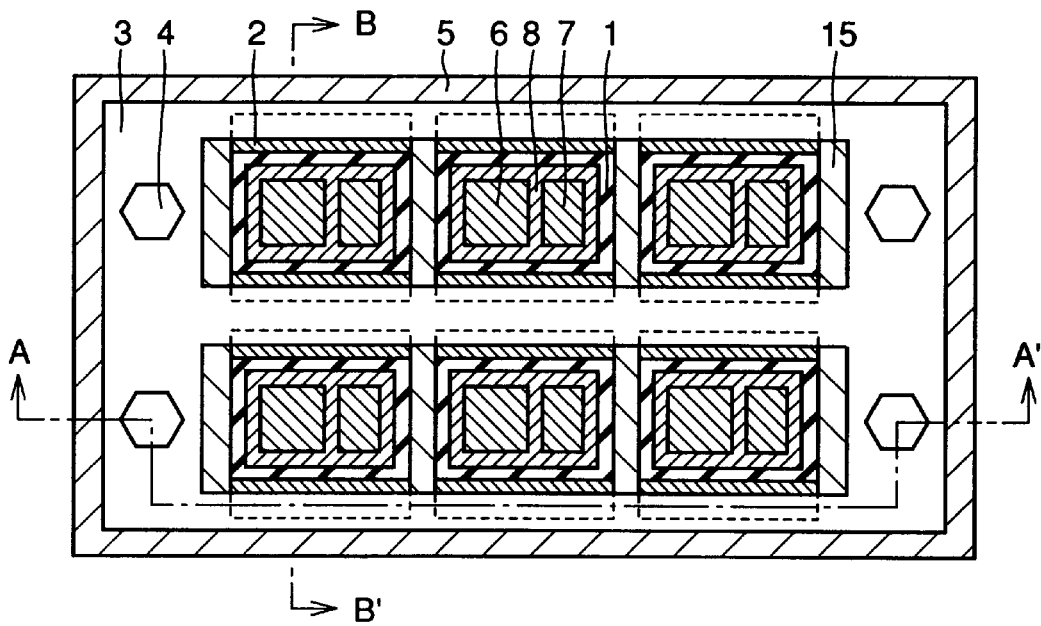
Figure 18B:
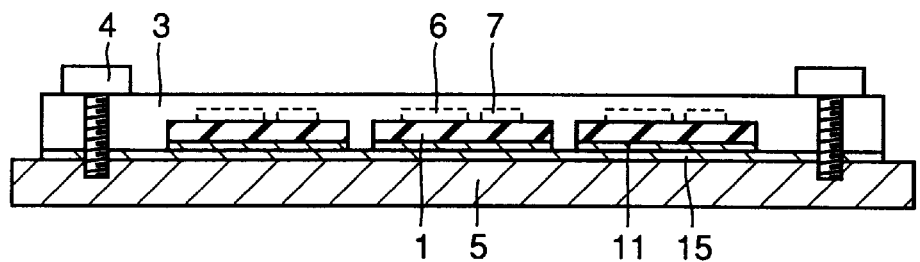
Figure 18C:
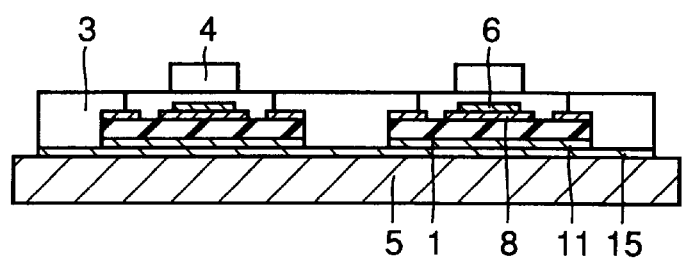

In the present example, six copper circuit bonded boards may be fixed by solder on a copper plate 15 having the width of about 75 mm, length of about 150 mm and thickness of about 1 mm with six recessed portions each having the width of 22 mm, length of 33 mm and the depth of 0.5 mm and four bolt holes such as shown in FIG. 18, and then the copper plate may be fixed on a base by fixing jig 3 (type 5). In that case, surface temperature of the heater (corresponding to the temperature of IGBT chip 6) increases by about 1° C. However, assembly of the module is facilitated.

Though examples of copper circuit bonded boards formed of aluminum nitride ceramics have been described, similar results could be obtained for copper circuit bonded boards of silicon nitride ceramics.

(EXAMPLE 9)

Copper circuit bonded board of ceramic base plate divided type having the structure shown in FIG. 19 was fabricated. Using a fixing jig (type 6) for fixing six copper circuit bonded boards having the length of 100 mm, width of 20 mm and thickness of 2 mm and copper conductive layers 8 each having the length of 14 mm, width of 29 mm and the thickness of 0.3 mm provided at three portions on the main surface, used in Example 7, the copper circuit bonded boards were fixed on aluminum base (300 mm×200 mm×10 mm) as a heat radiating plate 5.

In place of IGBT chip 6, a ceramic heater of 10 mm square was fixed by solder on each conductive layer, and a thermocouple was placed on the upper surface of the heater.

When six copper circuit bonded boards were fixed with the space between boards set to 15 mm, the surface temperature of the heater was 125° C., which was the same as the temperature of the board shown in FIG. 10 of Example 5. Here, the overall size of the power module (area) is about 60% of Example 5 (3×75 mm×150 mm), thus the power module can be reduced in size.

Though examples of copper circuit bonded boards formed of aluminum nitride ceramics have been described, similar results were obtained for copper circuit bonded boards of silicon nitride ceramics.

According to the present invention, when a board formed of ceramic base plate is mechanically fixed, cracks caused by stress concentration can be prevented and heat generated by the device can effectively be radiated. Therefore, a power module having high reliability can be realized at a low cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A power module board comprising a ceramic base plate, a current control unit arranged on a first portion of said ceramic base plate, and a fixing portion for fixing said ceramic base plate onto another plate, situated at a second portion of said ceramic base plate, wherein:

said current control unit includes a stacked structure comprising a first intervening layer stacked on said first portion of said ceramic base plate and a conductive layer stacked on said first intervening layer with said first intervening layer being interposed between said conductive layer and said first portion of said ceramic base plate, and a semiconductor device mounted on an uppermost surface of said stacked structure oriented away from said ceramic base plate;

said current control unit is sealed;

said fixing portion includes a fixing seat area comprising a second intervening layer arranged on said second portion of said ceramic base plate and a metal layer arranged on said second intervening layer with said second intervening layer being interposed between said metal layer and said second portion of said ceramic base plate.

2. The power module board according to claim 1, further comprising a heat radiating plate as said another plate, and a fixing member that is secured to said heat radiating plate and presses against said metal layer of said fixing portion so as to fix said ceramic base plate onto said heat radiating plate.

3. The power module board according to claim 2, wherein said fixing member is a bolt that passes through an opening in said ceramic plate.

4. The power module board according to claim 2, wherein said fixing member is a fixing jig that clampingly engages an edge area of said second portion of said ceramic base plate.

5. The power module board according to claim 1, wherein said ceramic base plate consists essentially of aluminum nitride ceramic.

6. The power module board according to claim 1, wherein said ceramic base plate consists essentially of silicon nitride ceramic.

7. The power module board according to claim 1, wherein said conductive layer consists essentially of a metal material containing as a main component any of copper, aluminum and nickel.

8. The power module board according to claim 1, wherein said metal layer consists essentially of a metal material containing as a main component any of copper, aluminum and nickel.

9. The power module board according to claim 1, further comprising a metal film arranged on a rear surface of said ceramic base plate opposite said current control unit and said fixing portion.

10. The power module board according to claim 9, wherein said metal film consists essentially of a metal material containing as a main component any of copper, aluminum and nickel.

11. A combination of the power module board according to claim 1, a heat radiating plate as said another plate, and a fixing jig engaging said metal layer of said fixing portion and secured to said heat radiating plate so as to fix said ceramic base plate onto said heat radiating plate, wherein said fixing jig comprises a core of copper or aluminum and an outer periphery of copper.

12. A power module comprising the power module board according to claim 1, an outer case enclosing said current control unit, and electrodes connected to said semiconductor device.

* * * * *

UNITED STATES PATENT AND TRADEMARK OFFICE
CERTIFICATE OF CORRECTION

PATENT NO. : 6,122,170
DATED : September 19, 2000
INVENTOR(S) : Hirose et al.

It is certified that error appears in the above-identified patent and that said Letters Patent is hereby corrected as shown below:

| | | |
|---|---|---|
| Col. 2, | line 7, | before "proportion", replace "higher" by --high--; |
| Col. 8, | line 31, | after "safety", replace "a specially" by --especially--; |
| Col. 12, | line 40, | before "and", replace "200 ps," by --200ps,--; |
| | line 64, | after "160", replace "W/m.K" by --W/m·K--; |
| | line 65, | after "100", replace "W/m.K" by --W/m·K--; |
| Col. 13, | line 16, | after "nitrogen", replace "air" by --gas--; |
| | line 52, | (actual line count), after "130", replace "kgf.cm" by --kgf·cm--; |
| | line 55, | (actual line count), replace the line to read: --kgf·cm--; |
| Col. 14, | line 64, | before "ceramic", replace "AfN" by --AlN--; |
| Col. 15, | line 59, | after "bonded", replace "board" by --boards--; |

Signed and Sealed this

First Day of May, 2001

Attest:

NICHOLAS P. GODICI

*Attesting Officer*      *Acting Director of the United States Patent and Trademark Office*